(12) United States Patent
Currivan et al.

(10) Patent No.: US 8,618,968 B2
(45) Date of Patent: Dec. 31, 2013

(54) DUAL DIGITAL TO ANALOG CONVERTERS (DACS) WITH CODEWORD PARSING

(75) Inventors: Bruce J. Currivan, Dove Canyon, CA (US); Thomas J. Kolze, Phoenix, AZ (US); Ramon A. Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 22 days.

(21) Appl. No.: 13/349,107

(22) Filed: Jan. 12, 2012

(65) Prior Publication Data

US 2012/0183027 A1 Jul. 19, 2012

Related U.S. Application Data

(60) Provisional application No. 61/433,128, filed on Jan. 14, 2011.

(51) Int. Cl.
*H03M 1/66* (2006.01)

(52) U.S. Cl.
USPC .......................................... 341/144; 341/145

(58) Field of Classification Search
USPC .................................. 341/144, 145
See application file for complete search history.

(56) References Cited

U.S. PATENT DOCUMENTS

| | | | | |
|---|---|---|---|---|
| 5,684,482 A * | 11/1997 | Galton | ........................... | 341/144 |
| 6,252,535 B1 * | 6/2001 | Kober et al. | ................... | 341/155 |
| 6,489,908 B2 * | 12/2002 | Panasik et al. | ................ | 341/144 |
| 6,535,154 B1 * | 3/2003 | Sculley | .......................... | 341/143 |
| 6,546,057 B1 * | 4/2003 | Yeap | .............................. | 375/285 |
| 6,603,418 B2 * | 8/2003 | Al-Awadhi | .................... | 341/144 |
| 6,603,804 B1 * | 8/2003 | Khoini-Poorfard et al. | .. | 375/152 |
| 7,501,969 B2 * | 3/2009 | Schoner | ........................ | 341/144 |
| 7,504,976 B1 * | 3/2009 | Pellon | ........................... | 341/143 |
| 7,715,490 B2 * | 5/2010 | Rezeq | ........................... | 375/295 |
| 8,022,850 B2 * | 9/2011 | Newman | ....................... | 341/144 |
| 8,212,703 B2 * | 7/2012 | Katsis et al. | .................. | 341/144 |
| 2004/0252042 A1 * | 12/2004 | Brooks et al. | ................. | 341/144 |

\* cited by examiner

*Primary Examiner* — Linh Nguyen

(74) *Attorney, Agent, or Firm* — Garlick & Markison; Shayne X. Short

(57) ABSTRACT

Dual digital to analog converters (DACs) with codeword parsing. With respect to a codeword that is provided to a DAC, a processing module (e.g., a rollover processor) operates to divide, partition, etc. the codeword into different respective sub-codewords as may be provided to two or more DAC's. Adaptation with respect to differently generated sub-codewords with respect to different respective codewords may be made in terms of any one or more of a variety of characteristics, including sub-codeword width (e.g., the number of bits included within a sub-codeword), quantization steps, etc. Moreover, such adaptation may be in consideration of any one or more local and/or remote operating characteristics of one or more devices, communication links, etc. within a communication system or network. Different respective sub-codewords undergo processing by different respective DAC's in generating respective analog signals for combination in generating a final or output analog signal.

23 Claims, 34 Drawing Sheets

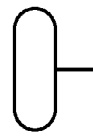

adaptively partitioning a first codeword into a first plurality of sub-codewords based on a first at least one characteristic 2511 adaptively partitioning a second codeword into a second plurality of sub-codewords based on the first or a second at least one characteristic 2521

adaptively partitioning a third codeword into a third plurality of sub-codewords based on the first, the second or a third at least one characteristic 2531

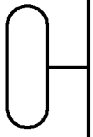

adaptively partitioning a codeword into a plurality of sub-codewords based on at least one of at least one local operating characteristic, or change thereof, of the device and at least one remote operating characteristic, or change thereof, of at least one additional device in communication with the device via at least one communication network 2510 operating a first digital to analog converter (DAC) for processing a first of the plurality of sub-codewords thereby generating a first analog signal 2520 operating a second DAC for processing a second of the plurality of sub-codewords thereby generating a second analog signal 2530 combining the first analog signal and the second analog signal thereby generating a third analog signal 2540

| Dec. Val. | MSB | | | LSB |
|---|---|---|---|---|
| 15 | 1 | 1 | 1 | 1 |
| 14 | 1 | 1 | 1 | 0 |
| 13 | 1 | 1 | 0 | 1 |
| 12 | 1 | 1 | 0 | 0 |
| 11 | 1 | 0 | 1 | 1 |
| 10 | 1 | 0 | 1 | 0 |
| 9 | 1 | 0 | 0 | 1 |
| 8 | 1 | 0 | 0 | 0 |
| 7 | 0 | 1 | 1 | 1 |
| 6 | 0 | 1 | 1 | 0 |
| 5 | 0 | 1 | 0 | 1 |
| 4 | 0 | 1 | 0 | 0 |
| 3 | 0 | 0 | 1 | 1 |
| 2 | 0 | 0 | 1 | 0 |
| 1 | 0 | 0 | 0 | 1 |
| 0 | 0 | 0 | 0 | 0 |

| Dec. Val. | MSB | | | LSB |
|---|---|---|---|---|
| -1 | 0 | 0 | 0 | -1 |
| -2 | 0 | 0 | -1 | 0 |
| -3 | 0 | 0 | -1 | -1 |
| -4 | 0 | -1 | 0 | 0 |
| -5 | 0 | -1 | 0 | -1 |
| -6 | 0 | -1 | -1 | 0 |
| -7 | 0 | -1 | -1 | -1 |
| -8 | -1 | 0 | 0 | 0 |
| -9 | -1 | 0 | 0 | -1 |
| -10 | -1 | 0 | -1 | 0 |
| -11 | -1 | 0 | -1 | -1 |
| -12 | -1 | -1 | 0 | 0 |
| -13 | -1 | -1 | 0 | -1 |
| -14 | -1 | -1 | -1 | 0 |
| -15 | -1 | -1 | -1 | -1 |

2600

- DAC encoding using positive, zero, or negative voltage or current sources (e.g., 4 bit embodiment)
  - DAC with ternary or tri-state current (or voltage) source
- each 'bit' may be implemented as respective 'symbol' (e.g., 2 values each such as 00, 01, 10)

DUAL DIGITAL TO ANALOG CONVERTERS (DACS) WITH CODEWORD PARSING

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

1. U.S. Provisional Patent Application Ser. No. 61/433,128, entitled "Method to extend the dynamic range of a digital-to-analog converter (DAC)," filed Jan. 14, 2011.

Incorporation by Reference

The following U.S. Utility patent applications are hereby incorporated herein by reference in their entirety and made part of the present U.S. Utility Patent Application for all purposes:

1. U.S. Utility patent application Ser. No. 13/118,429, entitled "Imbalance and distortion cancellation for composite analog to digital converter (ADC)," filed May 29, 2011, pending, which claims priority pursuant to 35 U.S.C. §120, as a continuation, to the following U.S. Utility Patent Application which is hereby incorporated herein by reference in its entirety and made part of the present U.S. Utility patent application for all purposes:

2. U.S. Utility patent application Ser. No. 12/949,752, entitled "Imbalance and distortion cancellation for composite analog to digital converter (ADC)," filed Nov. 18, 2010, now issued as U.S. Pat. No. 7,952,502 B2 on May 31, 2011, which claims priority pursuant to 35 U.S.C. §119(e) to the following U.S. Provisional Patent Application which is hereby incorporated herein by reference in its entirety and made part of the present U.S. Utility Patent Application for all purposes:

2.1. U.S. Provisional Application Ser. No. 61/392,604, entitled "Imbalance and distortion cancellation for composite analog to digital converter (ADC)," filed Oct. 13, 2010, now expired.

The U.S. Utility patent application Ser. No. 12/949,752 also claims priority pursuant to 35 U.S.C. §120, as a continuation-in-part (CIP), to the following U.S. Utility patent application which is hereby incorporated herein by reference in its entirety and made part of the present U.S. Utility patent application for all purposes:

3. U.S. Utility application Ser. No. 12/453,431, entitled "Analog to digital converter (ADC) with extended dynamic input range," filed May 11, 2009, now issued as U.S. Pat. No. 8,009,075 B2 on Aug. 30, 2011, which claims priority pursuant to 35 U.S.C. §119(e) to the following U.S. Provisional Patent Application which is hereby incorporated herein by reference in its entirety and made part of the present U.S. Utility patent application for all purposes:

3.1. U.S. Provisional Application Ser. No. 61/136,353, entitled "Analog to digital converter (ADC) with extended dynamic input range," filed Aug. 29, 2008, now expired.

4. U.S. Utility application Ser. No. 10/879,673, entitled "System and Method for adjusting multiple control loops using common criteria," filed on Jun. 29, 2004, now issued as U.S. Pat. No. 7,961,823 B2 on Jun. 14, 2011, which claims priority pursuant to 35 U.S.C. §119(e) to the following U.S. Provisional Patent Application which is hereby incorporated herein by reference in its entirety and made part of the present U.S. Utility patent application for all purposes:

4.1. U.S. Provisional Application Ser. No. 60/576,371, entitled "Dithering algorithm system and method," filed Jun. 2, 2004, now expired.

5. U.S. Utility application Ser. No. 10/880,959, entitled "High speed receive equalizer architecture," filed on Jun. 30, 2004, now issued as U.S. Pat. No. 7,623,600 B2 on Nov. 24, 2009, which claims priority pursuant to 35 U.S.C. §119(e) to the following U.S. Provisional Patent Application which is hereby incorporated herein by reference in its entirety and made part of the present U.S. Utility patent application for all purposes:

5.1. U.S. Provisional Application Ser. No. 60/576,176, entitled "High speed receive equalizer architecture," filed Jun. 2, 2004, now expired.

6. U.S. Utility application Ser. No. 12/269,865, entitled "Method and system for digital video broadcast for cable (DVB-C2)," filed on Nov. 12, 2008, pending, which claims priority pursuant to 35 U.S.C. §119(e) to the following U.S. Provisional Patent Application which is hereby incorporated herein by reference in its entirety and made part of the present U.S. Utility patent application for all purposes:

6.1. U.S. Provisional Application Ser. No. 60/987,371, entitled "DVB-C2," filed Nov. 12, 2007, now expired.

7. U.S. Utility application Ser. No. 13/223,094, entitled "Distortion and aliasing reduction for digital to analog conversion," filed on Aug. 31, 2011, pending, which claims priority pursuant to 35 U.S.C. §119(e) to the following U.S. Provisional Patent Application which is hereby incorporated herein by reference in its entirety and made part of the present U.S. Utility patent application for all purposes:

7.1. U.S. Provisional Patent Application Ser. No. 61/433,128, entitled "Method to extend the dynamic range of a digital-to-analog converter (DAC)," filed Jan. 14, 2011, pending.

8. U.S. Utility application Ser. No. 13/223,124, entitled "Distortion and aliasing reduction for digital to analog conversion," filed on Aug. 31, 2011, pending, which claims priority pursuant to 35 U.S.C. §119(e) to the following U.S. Provisional Patent Application which is hereby incorporated herein by reference in its entirety and made part of the present U.S. Utility patent application for all purposes:

8.1. U.S. Provisional Patent Application Ser. No. 61/433,128, entitled "Method to extend the dynamic range of a digital-to-analog converter (DAC)," filed Jan. 14, 2011, pending.

9. U.S. Utility application Ser. No. 13/223,156, entitled "Distortion and aliasing reduction for digital to analog conversion," filed on Aug. 31, 2011, pending, which claims priority pursuant to 35 U.S.C. §119(e) to the following U.S. Provisional Patent Application which is hereby incorporated herein by reference in its entirety and made part of the present U.S. Utility patent application for all purposes:

9.1. U.S. Provisional Patent Application Ser. No. 61/433,128, entitled "Method to extend the dynamic range of a digital-to-analog converter (DAC)," filed Jan. 14, 2011, pending.

10. U.S. Utility application Ser. No. 13/223,182, entitled "Distortion and aliasing reduction for digital to analog conversion," filed on Aug. 31, 2011, pending, which claims priority pursuant to 35 U.S.C. §119(e) to the following U.S. Provisional Patent Application which is hereby incorporated herein by reference in its entirety and made part of the present U.S. Utility Patent Application for all purposes:

10.1. U.S. Provisional Patent Application Ser. No. 61/433,128, entitled "Method to extend the dynamic range of a digital-to-analog converter (DAC)," filed Jan. 14, 2011, pending.

11. U.S. Utility patent application Ser. No. 13/349,000, entitled "Rollover operative digital to analog converter (DAC)," filed concurrently on Jan. 12, 2012, pending.

12. U.S. Utility patent application Ser. No. 13/349,260, entitled "Digital to analog converter (DAC) with ternary or tri-state current source," filed concurrently on Jan. 12, 2012, pending.

BACKGROUND OF THE INVENTION

1. Technical Field of the Invention

The invention relates generally to communication systems and/or electronic systems; and, more particularly, it relates to communication devices and/or devices within such systems performing conversion between and among digital and analog signal types.

2. Description of Related Art

Data communication systems have been under continual development for many years. Generally speaking, a data communication system may be viewed as supporting the transmission of any of a variety of types of information (e.g., data, voice, media, etc.) from a first location to a second location within such a communication system. Communication systems are known to support wireless and wire lined communications between wireless and/or wire lined communication devices. Also generally speaking, within the context of communication systems that employ various types of communication devices, there is a first communication device at one end of a communication channel with encoder capability and second communication device at the other end of the communication channel with decoder capability. In many instances, one or both of these two communication devices includes encoder and decoder capability (e.g., within a bi-directional communication system). Transferring information from one location to another can be applied generally within any type of communication system, including those that employ some form of data storage (e.g., hard disk drive (HDD) applications and other memory storage devices) in which data is processed and/or encoded before writing to the storage media, and then the data is processed and/or decoded after being read/retrieved from the storage media.

Certain communication systems employ one or more of various types of coding (e.g., error correction codes (ECCs) whose decoding may be performed iteratively) to ensure that the data extracted from a signal received at one location of a communication channel is the same information that was originally transmitted from another location of the communication channel. Communications systems with iterative codes are often able to achieve lower bit error rates (BER) than alternative codes for a given signal to noise ratio (SNR). ECCs, and the application of ECCs, are sometimes alternatively referred to as Forward Error Correction (FEC) codes and coding. In modern systems, the terminology "FEC" can be applied to systems incorporating FEC but including partial or full re-transmission, perhaps with feedback from the receiver to the transmitter based upon decoding success, decoding lack of success, or partial decoding results (e.g., in accordance with U.S. Utility application Ser. No. 12/269,865, entitled "Method and system for digital video broadcast for cable (DVB-C2)," which is incorporated by reference above).

In addition, any of a variety of types of communication systems may employ one or more of various types of signaling (e.g., orthogonal frequency division multiplexing (OFDM), orthogonal frequency division multiple access (OFDMA), code division multiple access (CDMA), synchronous code division multiple access (S-CDMA), time division multiple access (TDMA), etc.) to allow more than one user access to the communication system. Such signaling schemes may generally be referred to as multiple access signaling schemes.

In accordance with signals that are communicated within any of a variety of communication systems, within a transmitter communication device, digital signals typically undergo conversion to continuous time/analog signals for transmission or launching into one or more given communication channels. That is to say, one function that is oftentimes performed in accordance with transmitting a signal from one communication device to another is to perform conversion from the digital domain to the analog domain (e.g., using a digital to analog converter (DAC)). Such a continuous time/analog signal is oftentimes transmitted via a communication channel from one location to another (e.g., from one communication device to another, from one location to another location within a given communication device, etc.). Oftentimes, in accordance with performing such conversion from the digital domain to the analog domain, the conversion process may sometimes be performed less than perfectly (less than optimally) such that a digital signal may not sufficiently load the DAC.

For example, a digital codeword, when applied to a DAC for conversion to a corresponding analog signal, may underload the DAC such that an unacceptably low or insufficient power may be associated with the analog signal, or too low a signal to noise ratio (SNR) may be associated with the analog signal. And in even other situations, the conversion process may sometimes be performed less than perfectly such that a digital signal may overload a DAC. That is to say, a digital codeword, when applied to a DAC for conversion to a corresponding analog signal, may unfortunately extend beyond the linear and operable region of the DAC. In such situations, clipping and other nonlinear deleterious effects may be realized in accordance with the conversion from the digital domain to the analog domain. Even with near-optimal loading of a DAC, level errors in the DAC output (e.g., the analog output does not replicate precisely the relative numerical values attributed to the codewords input to the DAC) cause noise and harmonic and intermodulation distortion, as shown for example when one or two (or more) sinusoids are generated numerically and the DAC output is analyzed showing energy in the harmonic and intermodulation frequencies. Also contributing to the noise floor and nonlinear distortion in a DAC output are level-dependent differences in analog component values, including compression at excursions, sometimes not balanced or equal at positive and negative excursions. Phase noise or clock jitter in the DAC clocking signal also introduces distortion which can be characterized as intermodulation between the signal of interest (SOI) and the DAC clocking signal (including its phase noise or spurs).

In summary, the quantization of the numerically generated signals input to the DAC are a source of some nonlinear distortion, but level errors and nonlinear digital-word-value-to-analog-voltage-level transfer function also typically contributes additional nonlinear distortion, and level-dependent artifacts typically contribute additional significant nonlinear distortion, especially in DACs operating with high clocking frequencies. All of these nonlinear distortion mechanisms are typically contributing degradation, including nonlinear distortion characterized by generation of harmonics and intermodulation products, even without significant clipping from overloading. Overloading or underloading the DAC input typically exacerbates some or many of these nonlinear distortion mechanisms, including increasing the rate and/or amount of clipping distortion. Generally speaking, the prior art does not adequately provide for a means to address and overcome these and other deficiencies as may be experienced in accordance with digital to analog conversion within one or more DACs.

Within a communication device operative to receive a signal that has been transmitted via a communication channel, the corresponding reverse operation is performed in accordance with performing conversion from the analog to the digital domain (e.g., using an analog to digital converter (ADC)). That is to say, one function that is oftentimes performed when receiving a signal is to perform digital sampling thereof (e.g., using an ADC). When dealing with signals that may temporally vary across a relatively large dynamic range, performing such digital sampling can be problematic and incur certain deleterious effects such as undesirably low signal to noise ratios (SNRs) or undesirably large signal loading into the ADC. The prior art does not adequately provide for means to address and overcome these and other deficiencies as may be experienced in accordance with analog to digital conversion within one or more ADCs. In addition, it is noted that while the term and/or terminology of "codeword" is utilized in both error correction code (ECC) and digital to analog converter (DAC) related descriptions, the term and/or terminology of "codeword" has a different respective meaning for each respective application context (e.g., ECC vs. DAC related descriptions).

BRIEF DESCRIPTION OF THE SEVERAL VIEWS OF THE DRAWINGS

FIG. 25A and FIG. 25B illustrate various alternative embodiments of methods for operating one or more communication devices or devices including one or more DACs.

DETAILED DESCRIPTION OF THE INVENTION

Figure 1:
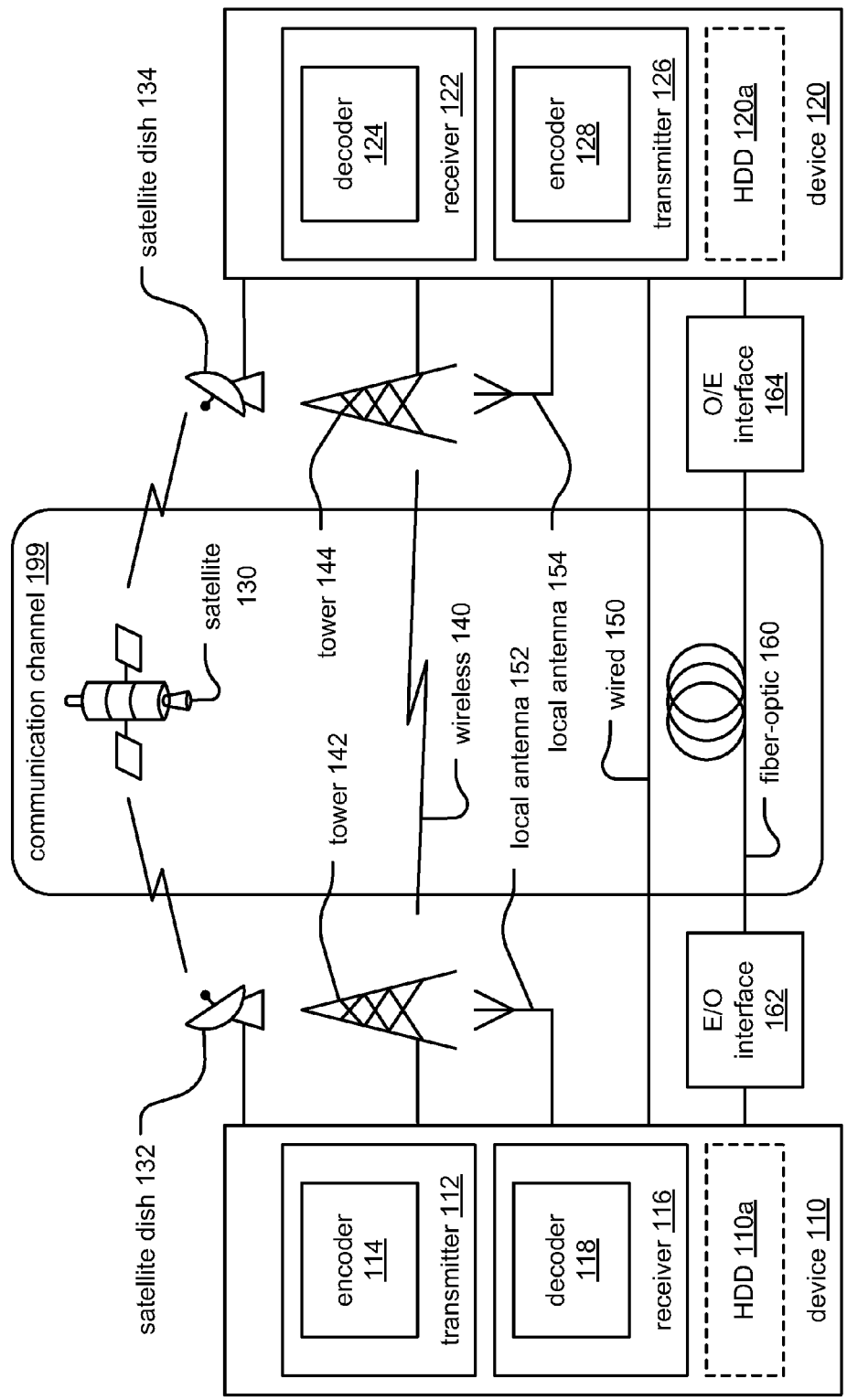
FIG. 1 and FIG. 2 illustrate various embodiments of communication systems.

Improvement in the performance of digital to analog signal conversion is presented herein. Reduction of various deleterious effects as may be experienced at both the upper and lower loading and reduction of limitations associated with digital to analog conversion, may be achieved in accordance with performing digital to analog conversion in accordance with various embodiments, aspects, and their equivalents, as presented herein.

As the reader will understand, conversion from the digital to the analog domain, such as may be performed within any of a variety of devices, may unfortunately be performed less than perfectly (due to practical restraints and limitations) and may suffer from a number of effects including spurious emissions. Generally speaking, one or more digital codewords are provided to one or more digital to analog converter (DACs) for generating one or more analog signals. It is noted here that such terminology as continuous-time signal, analog signal, etc. such as a signal that is output from a DAC, such as in accordance with the digital to analog conversion of a digital signal, may be used interchangeably. For brevity in accordance with various illustrations provided herein, analog signal is oftentimes used.

Typically, a digital signal is provided to a DAC in the form of a sequence of digital values, such as a digital bitstream, a sequence of digital codewords, a sequence of digital labels, etc. The individual respective values within the digital signal are successively and respectively applied to a DAC in accordance with generating an analog signal. A DAC is operative to seam the successive digital values within the digital signal together thereby forming the analog signal.

When a digital codeword is provided to a digital to analog converter (DAC) for conversion from the digital domain to the analog domain, the conversion process may be performed less than perfectly due to the inherent limitations of a DAC. Ideally, the conversion process would be performed linearly and perfectly for any given digital codeword. However, a typical DAC is operative to provide its best performance and its most linear performance within a certain range. When a digital codeword provided to a DAC is relatively large or reaching the upper end of the linear operating range of the DAC, the DAC may exhibit nonlinear characteristics including clipping in accordance with generating an analog signal. When a digital codeword exceeding the linear operational range of the DAC is applied thereto, the corresponding DAC will exhibit nonlinear characteristics including clipping in accordance with generating an analog signal. At this top end of the dynamic range of a given DAC, distortion may unfortunately be generated including third order harmonics and intermodulation products (e.g., and sometimes, $2^{nd}$ harmonics and intermodulation products and even higher order harmonics and intermodulation products). When the digital codeword provided to a DAC is relatively small or reaching the lower end of the operational range of the DAC, operation of the DAC may be quantization noise limited. At the lower end of the operational range, nonlinear distortion also may be manifested due to the relatively coarse quantization step size associated with the digital codewords when only a few of the least significant bits are varying for a duration of time (or number of successive codewords).

In accordance with appropriate operation of signal conversion from the digital domain to the analog domain, the operation of the DAC preferably would not be underloaded (e.g., being quantization noise limited, not providing an adequate output power, etc.) or overloaded (e.g., clipping, nonlinearity, distortion, aliasing, higher order harmonics, etc.). However, in real life applications, operation at or near the limitations of various devices, including near saturation of a DAC in which such a DAC exhibits nonlinear characteristics, is oftentimes unavoidable.

A number of different architectures are presented herein that they be applied for use in improving digital to analog conversion. Such conversion from the digital domain to the analog domain may be performed within any of a variety of contexts including communication systems, storage devices, etc. Sometimes, a given device includes functionality and/or circuitry therein for performing both conversion from the digital domain to the analog domain as well as conversion from the analog domain to the digital domain. For example, within a communication device such as a transceiver, generation of signals for transmission into one or more communication channels may be associated with digital to analog conversion, and processing of signals received from one or more communication channels may be associated with analog to digital conversion.

Aliased harmonic reduction, improved linearity, distortion cancellation, reduced skirt spectral skirts, and reduced spurious emissions in accordance with the various principles and aspects presented herein, may be performed for use by one or more digital to analog converters (DACs) within any of a variety of communication systems and/or applications. Such processing techniques, architectures, and/or approaches presented herein can be employed within a wide variety of communication systems, some types of which are described below.

Generally speaking, the goal of digital communications systems is to transmit digital data from one location, or subsystem, to another either error free or with an acceptably low error rate. In accordance with such digital communication systems, digital information is oftentimes transmitted from one communication device to at least one other. Within a transmitting communication device, digital information typically undergoes various processing to generate an analog signal suitable for launching into a communication channel. At the other end of the communication channel, a receiving communication device processes the received analog signal, which may have undergone some degradation or reduction in signal fidelity, in accordance with making estimates of the original digital information that underwent processing within the transmitting communication device. One of the processes performed with respect to the received analog signal is analog to digital conversion.

As shown in FIG. 1, data may be transmitted over a variety of communications channels in a wide variety of communication systems: magnetic media, wired, wireless, fiber, copper, and other types of media as well.

Figure 2:
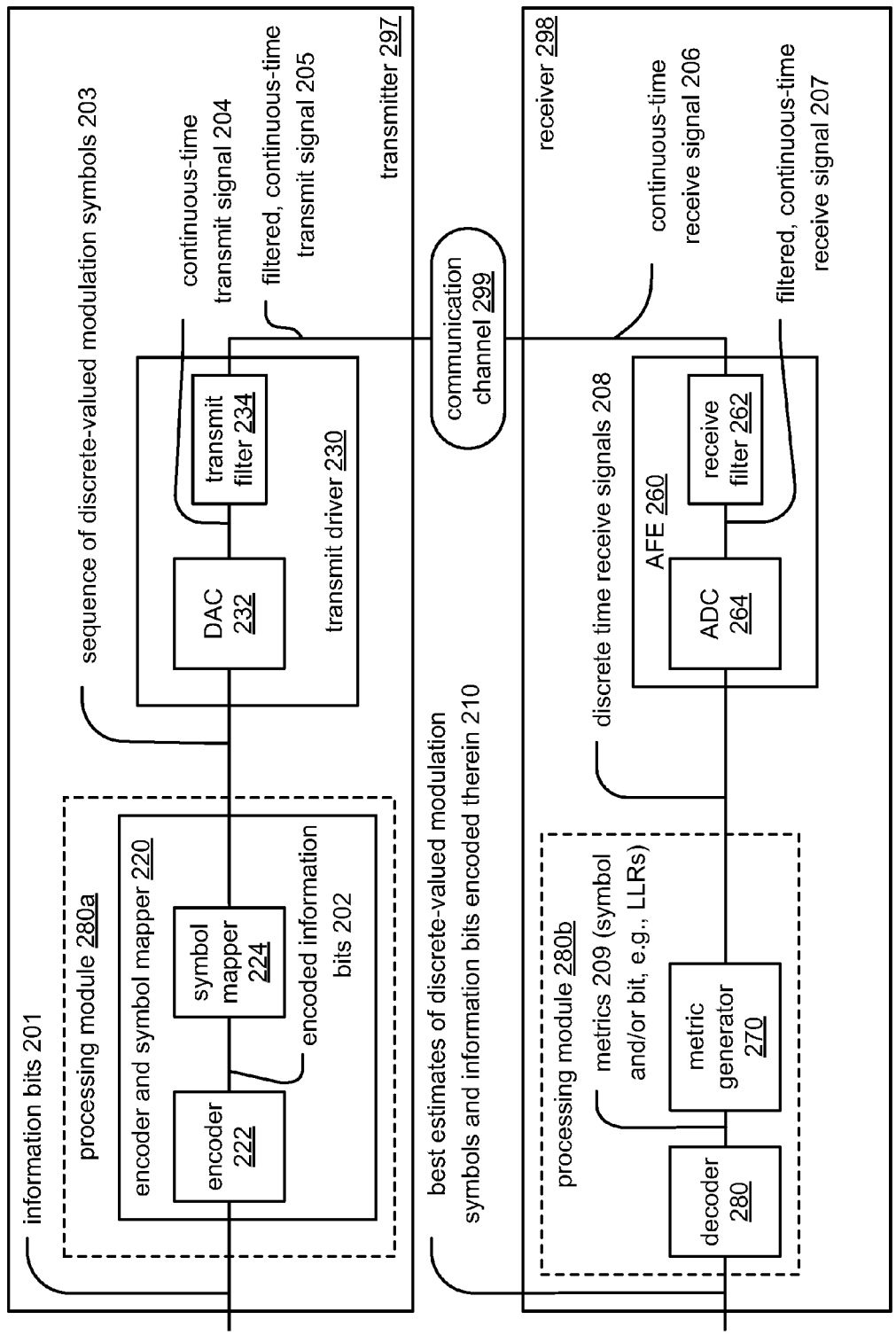

FIG. 1 and FIG. 2 are diagrams illustrate various embodiments of communication systems, respectively.

Referring to FIG. 1, this embodiment of a communication system is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Either one or both of the communication device 110 and the communication device 120 can include a hard disk drive (HDD) (or be coupled to a HDD). For example, the communication device 110 can include a HDD 110a, and the communication device 120 can include a HDD 120a.

It is noted that such communication devices 110 and/or 120 may be stationary or mobile without departing from the scope and spirit of the invention. For example, either one or both of the communication devices 110 and 120 may be implemented in a fixed location or may be a mobile communication device with capability to associate with and/or communicate with more than one network access point (e.g., different respective access points (APs) in the context of a mobile communication system including one or more wireless local area networks (WLANs), different respective satellites in the context of a mobile communication system including one or more satellite, or generally, different respective network access points in the context of a mobile communication system including one or more network access points by which communications may be effectuated with communication devices 110 and/or 120.

In some instances, to reduce transmission errors that may undesirably be incurred within a communication system, error correction and channel coding schemes are often employed. Generally, these error correction and channel coding schemes involve the use of an encoder at the transmitter and a decoder at the receiver. Clearly, a given communication device may include both an encoder and a decoder to effectuate bi-directional communication with one or more other communication devices; in other embodiments, a given communication device includes only encoding functionality (e.g., a transmitter type communication device) or only decoding functionality (e.g., a receiver type communication device).

Any of the various types of operations, processes, architectures, circuitries, etc. such as may be performed within a communication device including at least one digital to analog converter (DAC) therein, and their equivalents, can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit (TX) filter 234 to generate a filtered, continuous-time transmit signal 205 that substantially comports with the communication channel 299.

At a receiving end of the communication channel 299, continuous-time receive signal 206 is provided to an AFE (Analog Front End) 260 that includes an automatic gain control (AGC) circuit or module 261, a receive (RX) filter 262 (that generates a filtered, continuous-time receive signal 207) and one or more ADCs (Analog to Digital Converters) 264 (that generates discrete-time receive signals 208). The ADC(s) 264 may be viewed as incorporating imbalance and distortion cancellation/compensation functionality in accordance with the principles and/or aspects of the invention presented herein; such functionality may be directed to embodiments including two or more ADCs. Greater details are provided herein regarding various means by which such imbalance and distortion cancellation may be effectuated. A metric generator 270 calculates metrics 209 (e.g., on either a symbol and/or bit basis) that are employed by a decoder 280 to make best estimates of the discrete-valued modulation symbols and information bits encoded therein 210. The decoder 280 may be a forward error correction (FEC) decoder employing any of a variety of error correction codes (ECCs).

Within each of the transmitter 297 and the receiver 298, any desired integration of various components, blocks, functional blocks, circuitries, etc. therein may be implemented. For example, this diagram shows a processing module 280*a* as including the encoder and symbol mapper 220 and all associated, corresponding components therein, and a processing module 280 is shown as including the metric generator 270 and the decoder 280 and all associated, corresponding components therein. Such processing modules 280*a* and 280*b* may be respective integrated circuits. Of course, other boundaries and groupings may alternatively be performed without departing from the scope and spirit of the invention. For example, all components within the transmitter 297 may be included within a first processing module or integrated circuit, and all components within the receiver 298 may be included within a second processing module or integrated circuit. Alternatively, any other combination of components within each of the transmitter 297 and the receiver 298 may be made in other embodiments.

As the reader will understand, various aspects and principles of the invention are operative to ensure proper performance in accordance with conversion of one or more signals from the digital domain to the analog domain. For example, such deleterious effects as clipping, aliasing, higher-order harmonics, etc. may be mitigated within one or more DACs employed to perform conversion of one or more signals from the digital domain to the analog domain.

The processing of signals within either of the previous embodiments, and/or others herein, may be implemented to include various aspects and/or embodiments of the invention therein (e.g., any such embodiment that includes conversion of one or more signals from the digital domain to the analog domain, such as by one or more DACs, etc.). In addition, several of the following Figures describe other and particular embodiments (some in more detail) that may be used to support the devices, systems, functionality and/or methods that may be implemented in accordance with certain aspects and/or embodiments of the invention.

Figure 3:
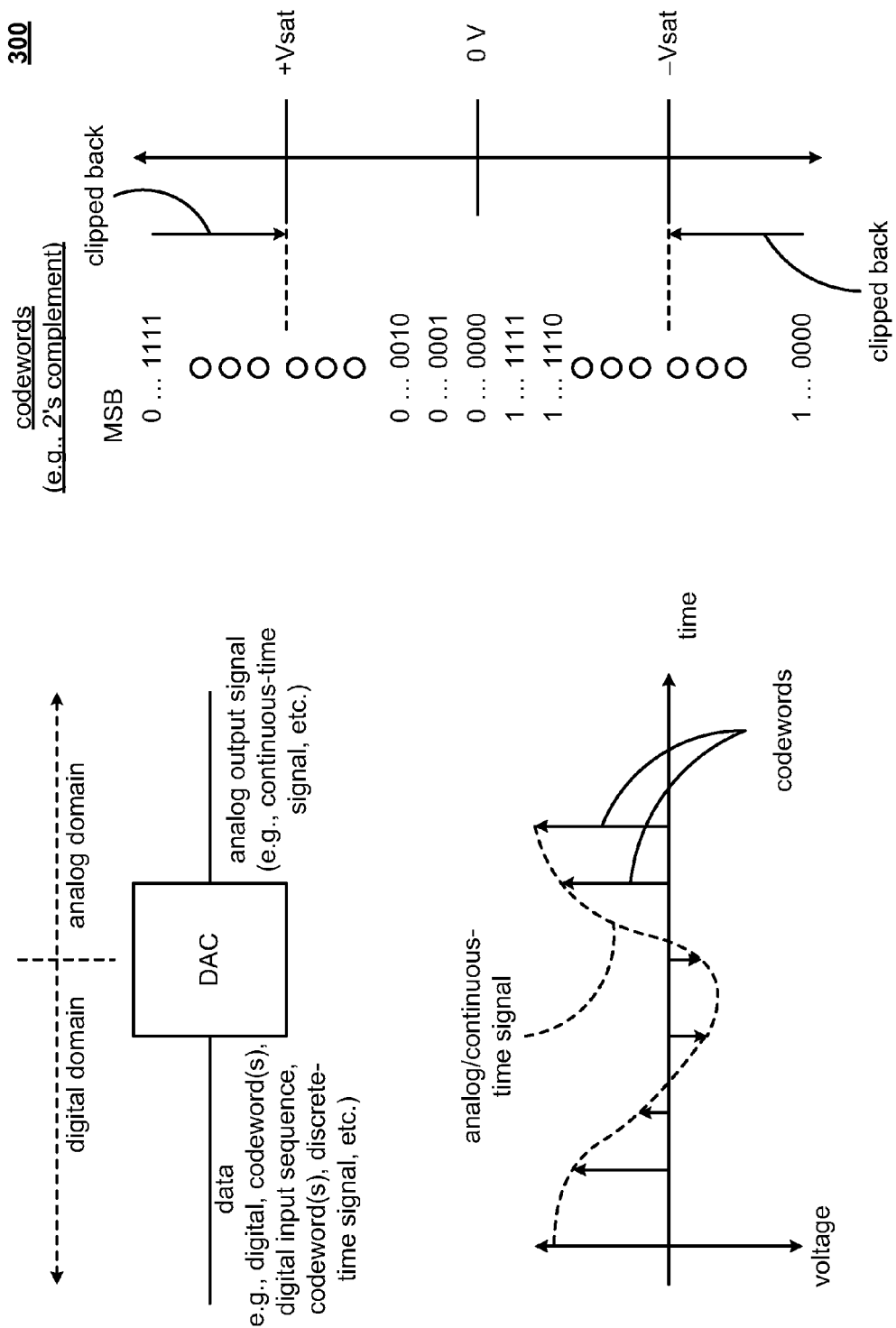
FIG. 3 illustrates an embodiment of digital to analog conversion.

FIG. 3 illustrates an embodiment 300 of digital to analog conversion. In accordance with conversion of signals from the digital domain to the analog domain, such conversion processing may be effectuated using a digital to analog converter (DAC). Data (e.g., digital, codewords, etc.) is provided to a DAC from which an analog signal is output. Oftentimes, the digital signal is composed of symbol labels, codewords, etc. that respectively are mapped to a corresponding voltage. For example, depending upon the particular value of a codeword that is provided to a DAC, a corresponding voltage is output from that DAC.

Referring to the lower left-hand side of the diagram, it can be seen that as different respective codewords are provided to a DAC, corresponding output voltages are provided from that DAC. Oftentimes, such a DAC performs the appropriate processing to ensure that the analog signal is in fact a continuous-time signal. Again, as mentioned elsewhere herein, such terminology as analog signal, continuous-time signal, etc. may be used interchangeably.

A DAC will oftentimes have a particular linear operating range. Referring to the right-hand side of the diagram, it can be seen that the linear operating range of a DAC may be viewed as extending between a positive saturation voltage and a negative saturation voltage. When a codeword is provided to the DAC that corresponds to a voltage that is beyond this linear operating range, the actual output voltage from the DAC will be clipped back to the respective positive saturation voltage or the negative saturation voltage.

It is noted that such operation, such as saturation or overloading of the DAC, can result in a number of deleterious effects including nonlinear distortion, clipping, aliasing, generation of intermodulation products, higher-order harmonics being aliased downward in frequency, etc.

Herein, a variety of different approaches are presented to deal with, minimize, reduce, or eliminate such deleterious effects. Various embodiments provide means for improving digital to analog conversion. Sometimes, a second DAC is particularly employed to operate in accordance with and cooperatively with a first DAC to reduce and/or eliminate such deleterious effects.

It is noted that such improvements as may be effectuated for digital to analog conversion of signals may be implemented within any of a variety of devices. In the context of communication systems, a communication device will oftentimes include at least one DAC. Digital signals are converted into analog signals in accordance with generating a signal that is compliant with a communication channel with which such a communication device may interact. Such types of communication devices include transceivers, transmitters, etc. and generally any type of communication device that will perform digital to analog conversion of signals therein. In addition, other types of devices may also include in accordance with various aspects, and their equivalents, of the various means, functionalities, architectures, etc. as presented herein for effectuating digital to analog conversion of signals. That is to say, certain types of devices that are not necessarily communication devices may nonetheless performed digital to analog conversion in accordance with their respective operation. Any such device implemented to perform digital to analog conversion can employ such functionality as described herein.

Within many of the various embodiments and/or diagrams presented herein, it is noted that certain additional components, functional blocks, circuitries, etc. may also be included without departing from the scope and spirit of the invention. For example, certain embodiments and/or diagrams illustrate respective subsets of different components, functional blocks, circuitries, etc. that can operate in conjunction and cooperatively with one another. Moreover, it is noted that alternative embodiments may be viewed as being respective subsets of the components, functional blocks, circuitries, etc. included within a pictorially illustrated embodiment and/or diagram (e.g., in accordance with various aspects, and their equivalents, of the invention may be found within a subset of the components, functional blocks, circuitries, etc. included within a given diagram).

With respect to operation of a digital to analog converter (DAC), one limitation and consideration of such a DAC is its limited linear range. Generally speaking, a DAC has a certain range of input values over which it operates (e.g., over which it operates linearly). For example, the input range may be the set of integers from L1 to L2 (e.g., which are oftentimes represented as digital information, codewords, bit sequences, etc.). Typical input values for a DAC with N bits and twos complement notation may be as follows:

L1=$-2^{N-1}$ and L2=$2^{N-1}-1$.

Alternatively, the following symmetric range may be used:
L1=$2^{N-1}+1$ and L2=$2^{N-1}-1$.

Digital logic and/or circuitry ahead of a DAC typically clips (saturates) any digital signal values which fall outside this range. When clipping occurs, a sample with value less than L1 is replaced with L1, and a sample with value greater than L2 is replaced with L2.

The result of clipping, viewed at the DAC output, is that portion which lies outside of the output voltage range of the DAC (e.g., corresponding to the input code range) at which the DAC clips the digital output signal. When clipping occurs, the output voltage no longer accurately represents the desired (unclipped) digital signal, and the output signal to noise ratio (SNR) is often significantly degraded.

Figure 4:
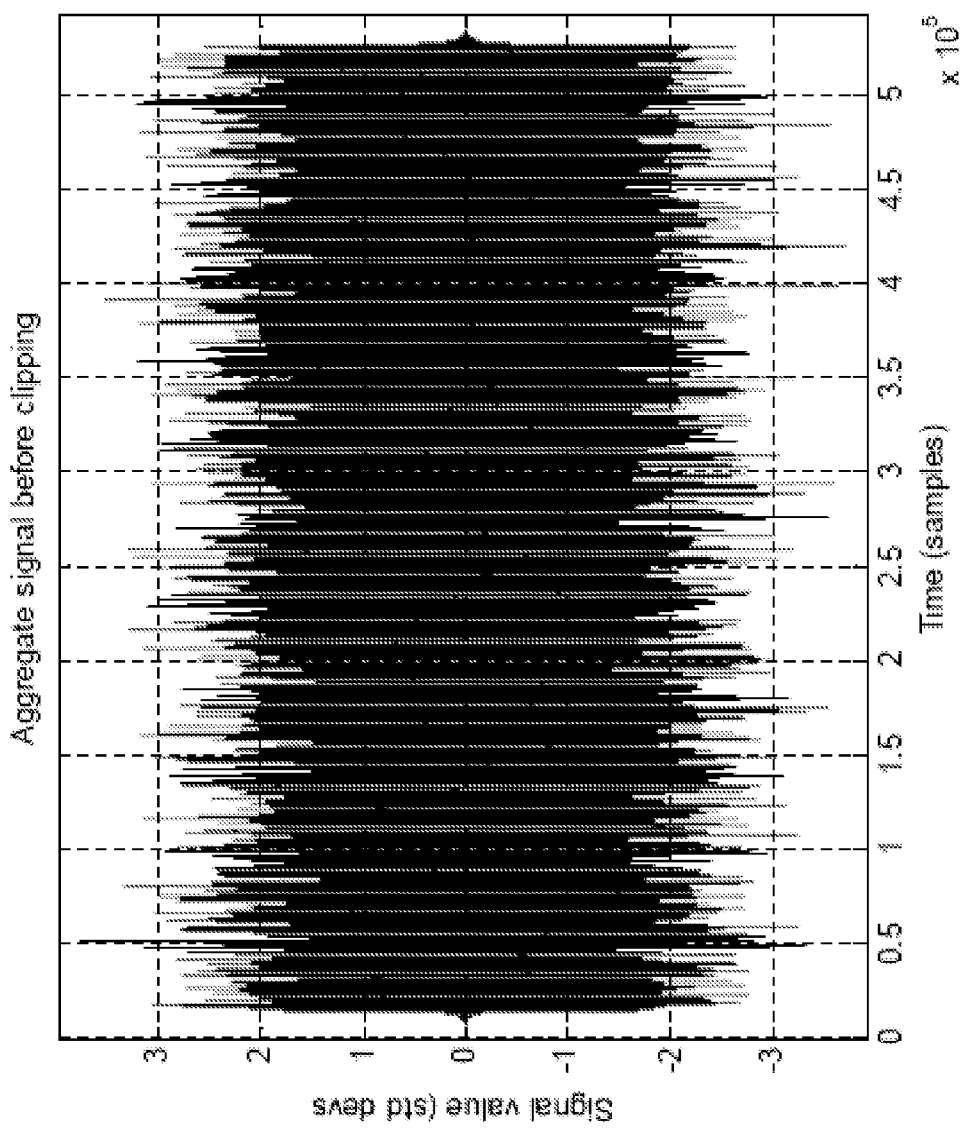
FIG. 4 illustrates an embodiment of a communication signal before clipping is applied.

FIG. 4 illustrates an embodiment 400 of a communication signal before clipping is applied.

Figure 5:
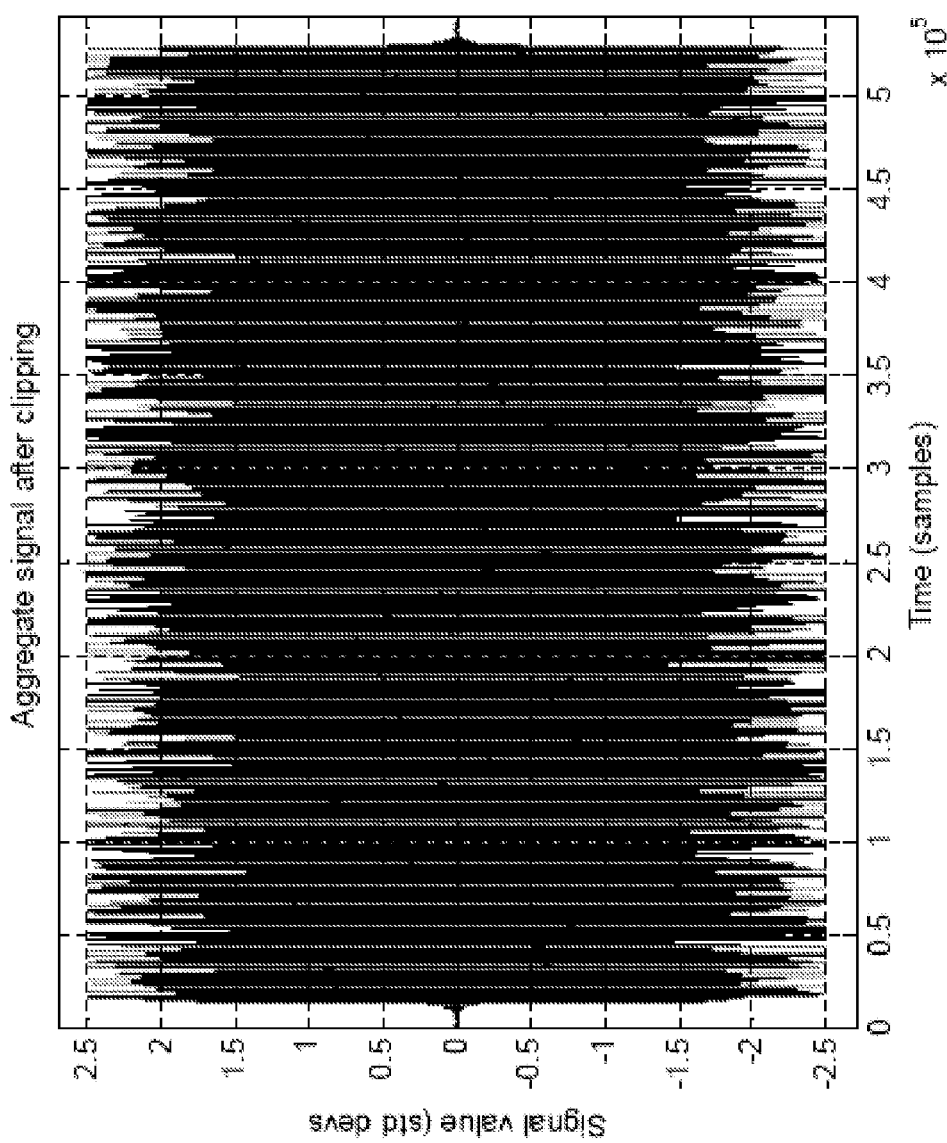
FIG. 5 illustrates an embodiment of a communication signal after clipping at value of +/−2.5 standard deviations (approximately 8 dB backoff).

FIG. 5 illustrates an embodiment 500 of a communication signal after clipping at value of +/−2.5 standard deviations (approximately 8 dB backoff).

Figure 6:
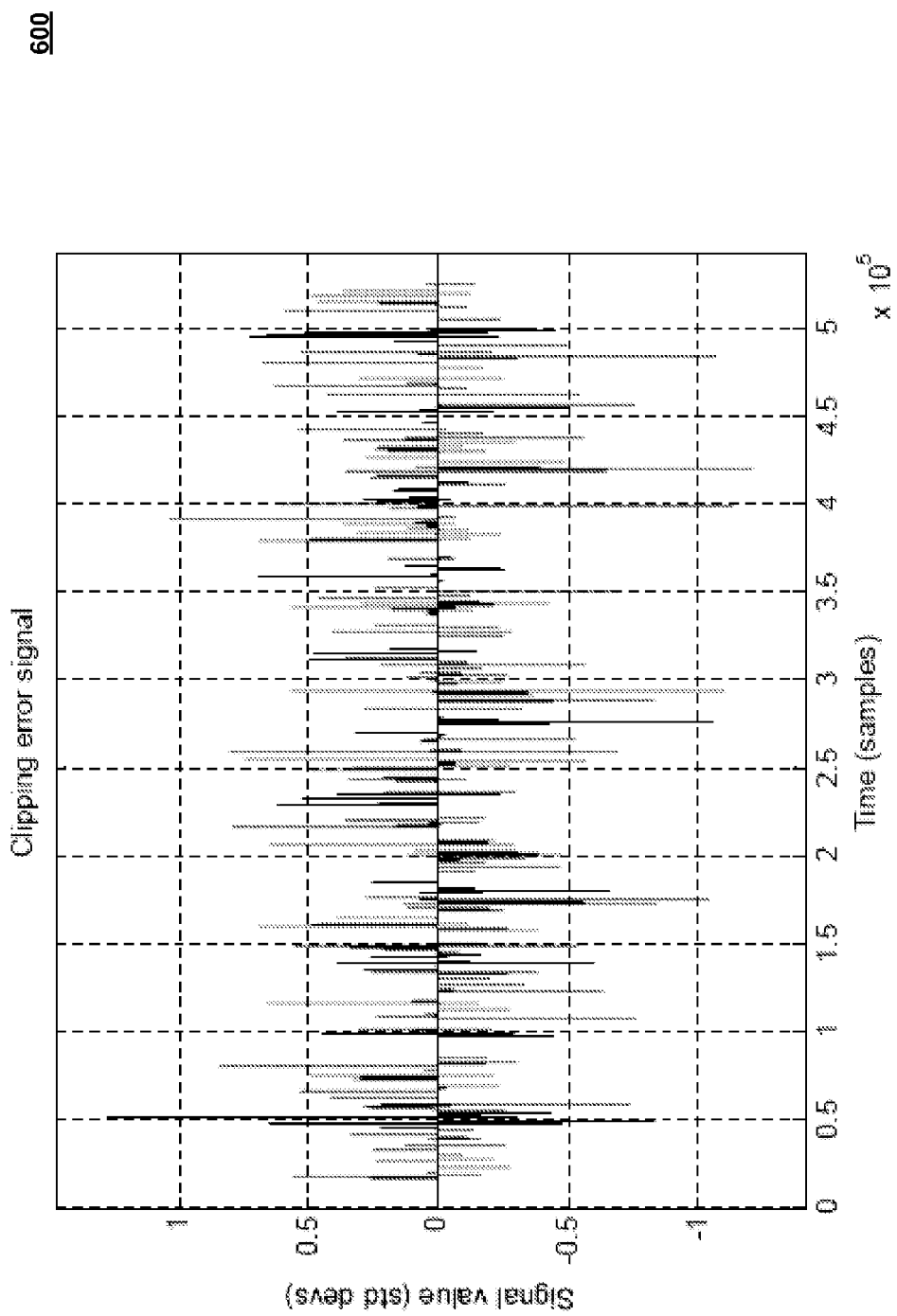
FIG. 6 illustrates an embodiment of a graph of peaks which have been clipped from the signal in the previous two diagrams (e.g., in FIG. 4 and FIG. 5).

FIG. 6 illustrates an embodiment 600 of a graph of peaks which have been clipped from the signal in the previous two diagrams (e.g., in FIG. 4 and FIG. 5).

Figure 7:
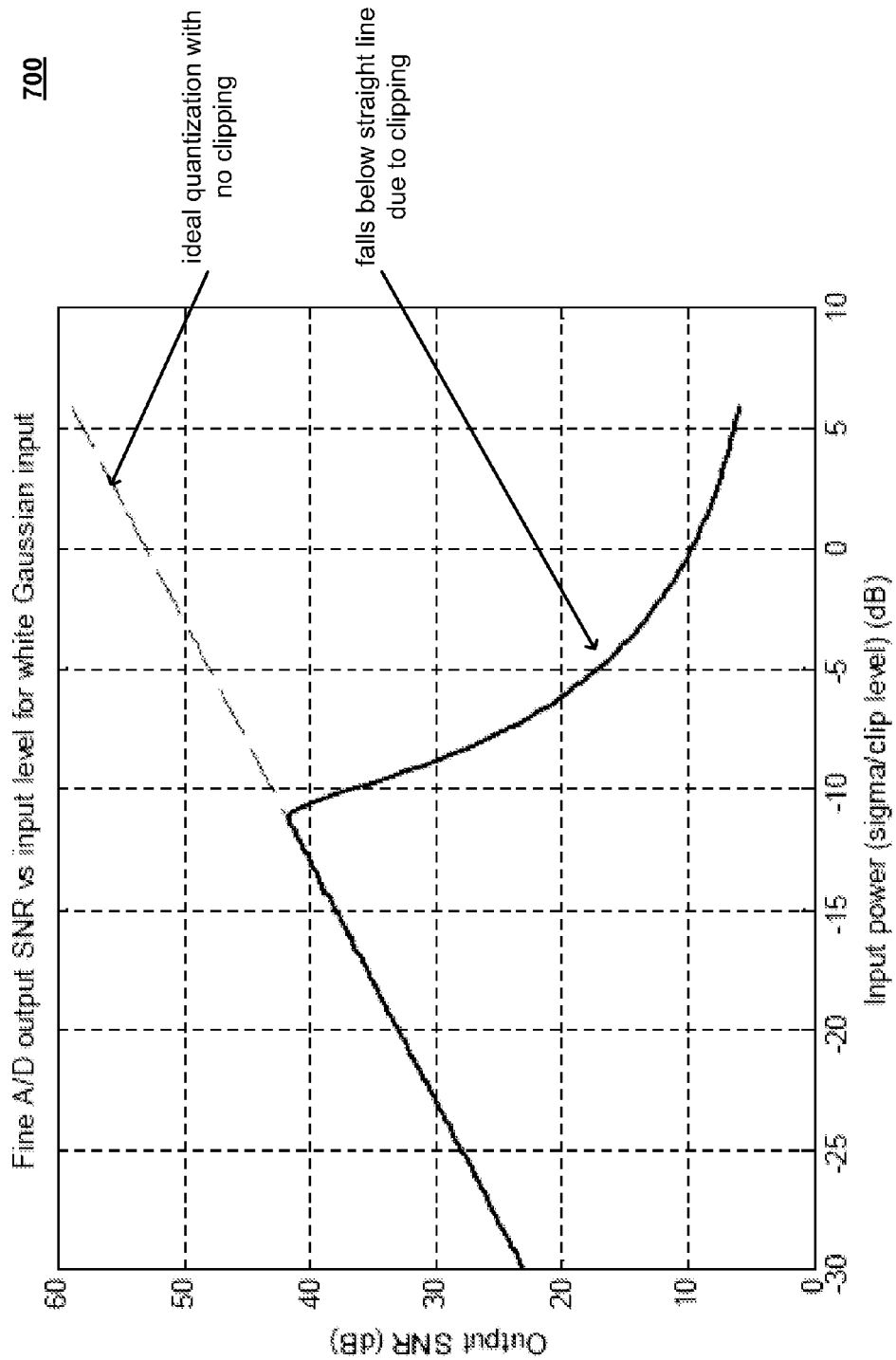
FIG. 7 illustrates an embodiment of an operating curve (signal to noise ratio (SNR) vs. loading) of an 8-bit digital to analog converter (DAC) with an approximate Gaussian input signal distribution.

FIG. 7 illustrates an embodiment 700 of an operating curve (signal to noise ratio (SNR) vs. loading) of an 8-bit digital to analog converter (DAC) with an approximate Gaussian input signal distribution.

Input signals to a DAC have a distribution of signal levels. For certain applications (e.g., such as communications signals within various communication systems), such a distribution or probability density function (PDF) may be approximated by the Gaussian distribution. For such an approximate Gaussian input, the tails of the distribution begin to clip the DAC even when the root mean squared (RMS) value of the input is well below the clipping point.

This effect is illustrated in this diagram for an ideal 8-bit DAC. In that diagram, it can be seen that without clipping (straight line, ideal quantization with no clipping), the output SNR would continue increasing indefinitely with input signal level. However, with clipping (the darker black line which curves down and to the right), the output SNR peaks and rapidly degrades at an input loading of around −12 dB (i.e., backoff of 12 dB relative to clip level). This rapid degradation occurs because the tails of the input signal distribution begin to clip the DAC more and more often as the input power is increased.

By way of definition herein, the output SNR is defined as the ratio of the desired-signal power to the "noise," which includes all other power, at the DAC output. The noise thus includes quantization error and distortion. The input loading is defined as the ratio of the RMS input signal level to the DAC clip level. A peak-loaded sine wave (one which just begins to clip the DAC) has a loading of −3.0 dB according to this definition.

One measure of performance of a DAC is its input dynamic range at a given output SNR. For example, in a communications receiver application, a 40 dB DAC output SNR may be required in order to meet the specified system link budget. As input levels vary due to unknown signal conditions, the DAC output may fall below this desired SNR operating point. The input level range over which the DAC provides the specified output SNR, may be called its signal-level dynamic range. In FIG. 7, it can be seen that that the ideal 8-bit DAC provides only about 3 dB of signal-level dynamic range at 40 dB output SNR. That is, the input range over which the output remains above 40 dB is about 3 dB.

Another measure of performance of a DAC is its spurious spectral performance. Spurious products include harmonics, intermodulation products, and other undesirable frequency content. Clipping of the DAC may cause unacceptable spurious spectral products in the output.

Another measure of performance of a DAC is the symbol error rate of a communications receiver which is receiving the output signal from the DAC. Clipping of the DAC effectively causes time-domain spikes in the analog signal, which may cause errors in the receiver. These symbol errors can be corrected by forward error correction (FEC) (and/or error correction code (ECC)) circuitry in the receiver; however, the presence of the symbol errors acts to reduce the effectiveness of the FEC in correcting other errors that may be present in the system. The net result is a loss of margin in the communications link due to the clipping of the DAC.

Various novel methods, architectures, implementations, and/or means, etc. presented herein provide for a number of improvements over solutions existent in the prior art including increasing the signal-level dynamic range, output SNR, and spurious and error-rate performance of a DAC. One embodiment operates by increasing the number of bits of precision of the quantizer. However, in certain instances, such an approach may be viewed as being expensive since increasing the number of bits of precision of a DAC, together with decreasing its thermal noise floor, increases its area and power. Alternative novel methods, architectures, implementations, and/or means, etc. presented herein provide for an increase of the signal-level dynamic range, output SNR, spurious and error performance of a DAC without increasing the number of bits of precision of the quantizer. In addition, such various novel methods, architectures, implementations, and/or means, etc. presented herein provide ways to reduce, soften, cancel and/or eliminate the effects of clipping. In current technology, clipping causes a sudden, large error which rapidly degrades the output SNR as seen in FIG. 7. In some instances, a digital input signal may extend above a clip point of a DAC, and appropriate handling of such effects appropriate processing and/or modification of the clipped samples can be made with respect to the DAC output so as to reduce any deleterious effects of clipping.

With respect to comparisons between analog to digital converters (ADCs) and digital to analog converters (DACs), an ADC clips when the input analog signal exceeds the input range. That is, with respect to an ADC, it is the analog signal which has its peaks clipped off. These clipped peak samples are in general lost and are not of further availability for processing in a typical ADC. In contrast, a DAC clips when the input digital signal exceeds the input range of the DAC. That is, with respect to a DAC, it is the digital signal which has its peaks clipped off, causing the output analog signal to clip as well. This implies that the peaks or samples of the input signal which exceed the DAC input range, which call be referred to as "clipped samples" and denoted by p(n), are readily available and intact, in digital form, for storage and for further processing. Appropriate handling of such "clipped samples" may be made to take advantage of this fact and to utilize the clipped samples to correct the clipping distortion.

One approach by which exploiting clipped samples may be made is to provide a second DAC, called herein an "auxiliary DAC" (or more than one additional DAC, which may be called "auxiliary DACs"). When the main DAC clips, the clipped samples are converted in the auxiliary DAC and the result added to the main DAC output. This provides an extended range over which the signal does not clip.

In general, the effective quantization step size of the auxiliary DAC may be different than the effective quantization step size of the main DAC. To reduce complexity, the quantization step size of the auxiliary DAC may be larger (coarser) than the quantization step size of the main DAC. However, these larger quantization steps, even if uncompensated, are still much preferable to clipping.

When the quantization step size of the auxiliary DAC is larger (coarser) than the quantization step size of the main DAC, the signal in the main DAC may be adjusted to compensate for the coarse steps in the auxiliary DAC. This results in a fine granularity at the output in spite of the coarse steps in the auxiliary DAC.

Figure 8:
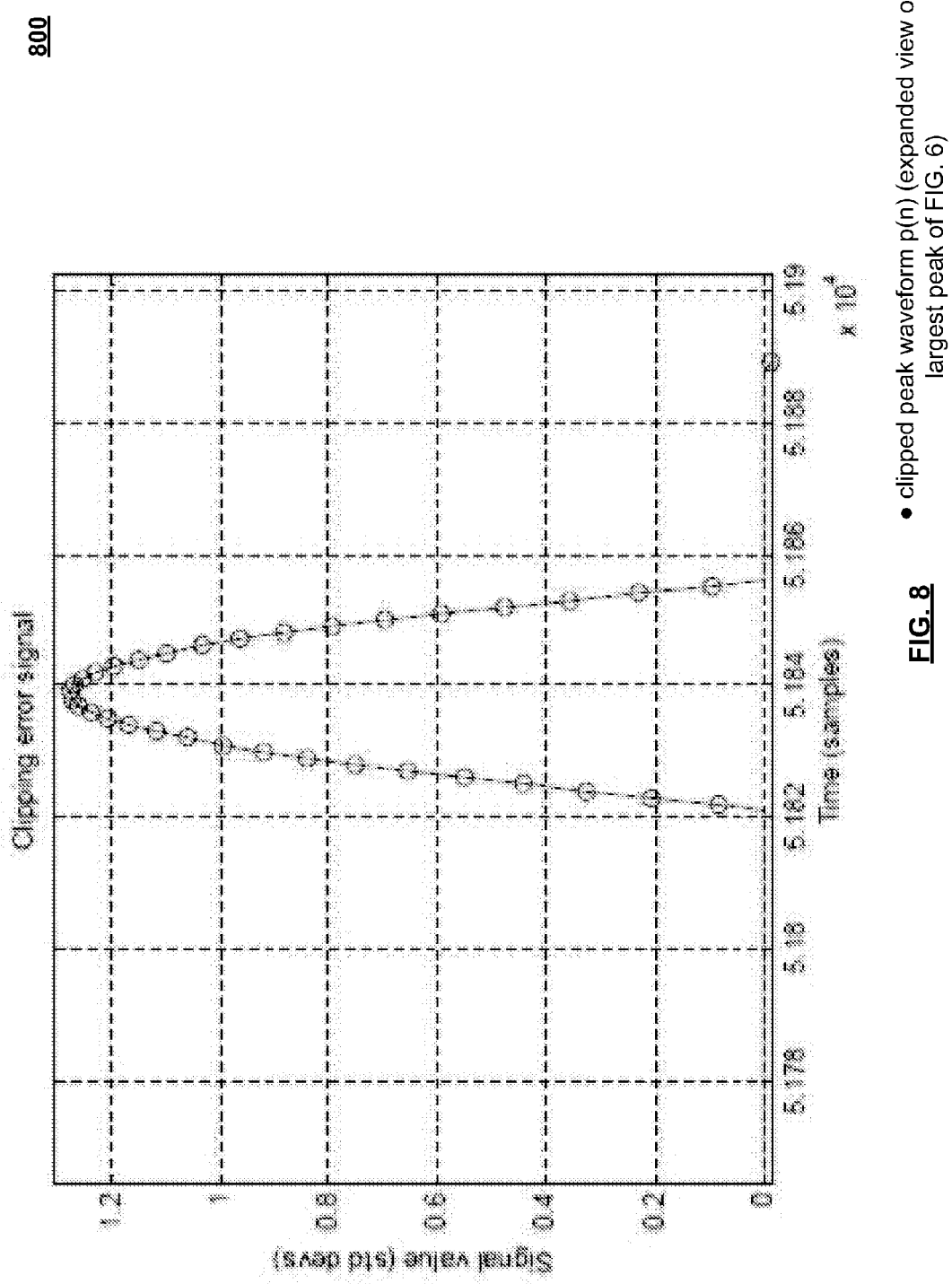
FIG. 8 illustrates an embodiment of a clipped peak waveform p(n) (expanded view of largest peak of FIG. 6).

FIG. 8 illustrates an embodiment 800 of a clipped peak waveform p(n) (expanded view of largest peak of FIG. 6). To further reduce complexity, the clipped samples p(n) may be approximated by a simplified peak waveform q(n). As an example, assume a given digital waveform has been clipped, and the clipped samples have a specific arbitrary shape p(n), shown by example in the diagram. In this example, there are approximately 32 samples describing the peak, indicating significant oversampling of the waveform in the DAC.

In many applications, the DAC is operated with input loading such that clipping is rare. In the example shown in FIG. 8 with 8 dB backoff, only 1 out of every 100 samples is clipped. The clipped waveform p(n) in such an example will appear as a series of narrow impulse-like peaks. Although each of these peaks may be ideally and accurately represented and added to the DAC output using an auxiliary DAC, in some instances, a compromise may be made, in order to reduce complexity, and peaks may be added which are approximation(s) to the actual peaks. Each peak, in one method, can be represented by a generic waveform with a set of parameters. For example, a rectangular pulse may be used to represent the generic waveform q0(n). Each peak q(n) is generated by selecting a number of samples for the width, and the height of each sample. These two parameters may be selected by fitting the actual peak p(n) to the approximate peak q(n), using, for example, least squares (LS) techniques. As a second example, a triangular pulse may be used to represent the generic waveform q0(n). As a third example, a parabolic pulse may be used to represent the generic waveform q0(n). A parabola may be a good fit for the waveform p(n) shown in the exemplary embodiment of FIG. 8. As a fourth example, a pulse which is naturally occurring in a given circuit implementation (e.g., an impulse response of a given circuit that is producing the auxiliary DAC output) may be used to represent. Generally, any generic pulse q0(n) may be used, and its parameters adjusted to produce a pulse q(n) which best fits the actual clipped peak p(n). In addition, other degrees of freedom may be adjusted to make the resulting DAC output closely approximate the desired peak waveform p(n), as is explained with respect to other embodiments and/or diagrams.

There are several ways of implementing extended dynamic range in a DAC. Some embodiments and/or architectures use a single DAC followed by a switchable gain and offset to select the range on each sample. Other methods have multiple DACs, with means to select, offset and scale the appropriate DAC signal on each sample. In some cases the multiple DACs are identical other than their output scaling, while in the more general case the multiple DACs differ in number of bits of precision, sampling frequency, and other parameters.

Figure 9:
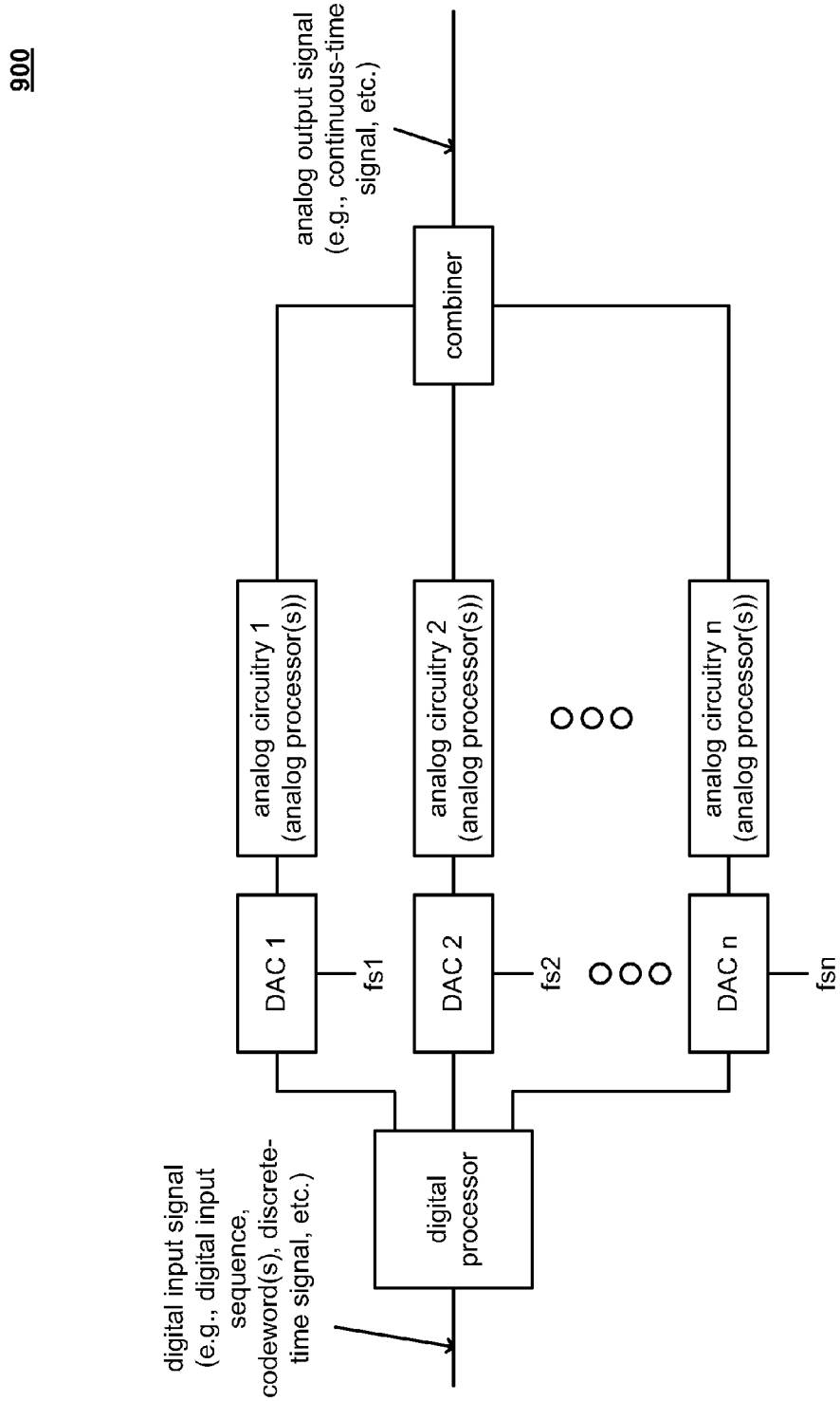
FIG. 9 illustrates an embodiment of an extended range DAC (including 2 or more [up to n] DACs).

FIG. 9 illustrates an embodiment 900 of an extended range DAC (including 2 or more [up to n] DACs). This diagram shows an extended-range DAC which operates as follows: the digital input signal enters at the left of the diagram and is routed through one or more digital processing logics, circuitries, modules, etc. which may typically consist of overflow processing, scaling and distribution logic, to N DACs. Each DAC may in general have a unique sampling frequency, fs1 to fsn, and a unique number of bits of precision. The output of each DAC is further processed in an analog processing block, which may in its simplest form consist of a gain and offset. The combiner accepts the outputs of DAC 1 through DAC n and combines them (in its simplest form of the combiner, simply adds them) to produce the composite output.

Figure 10:
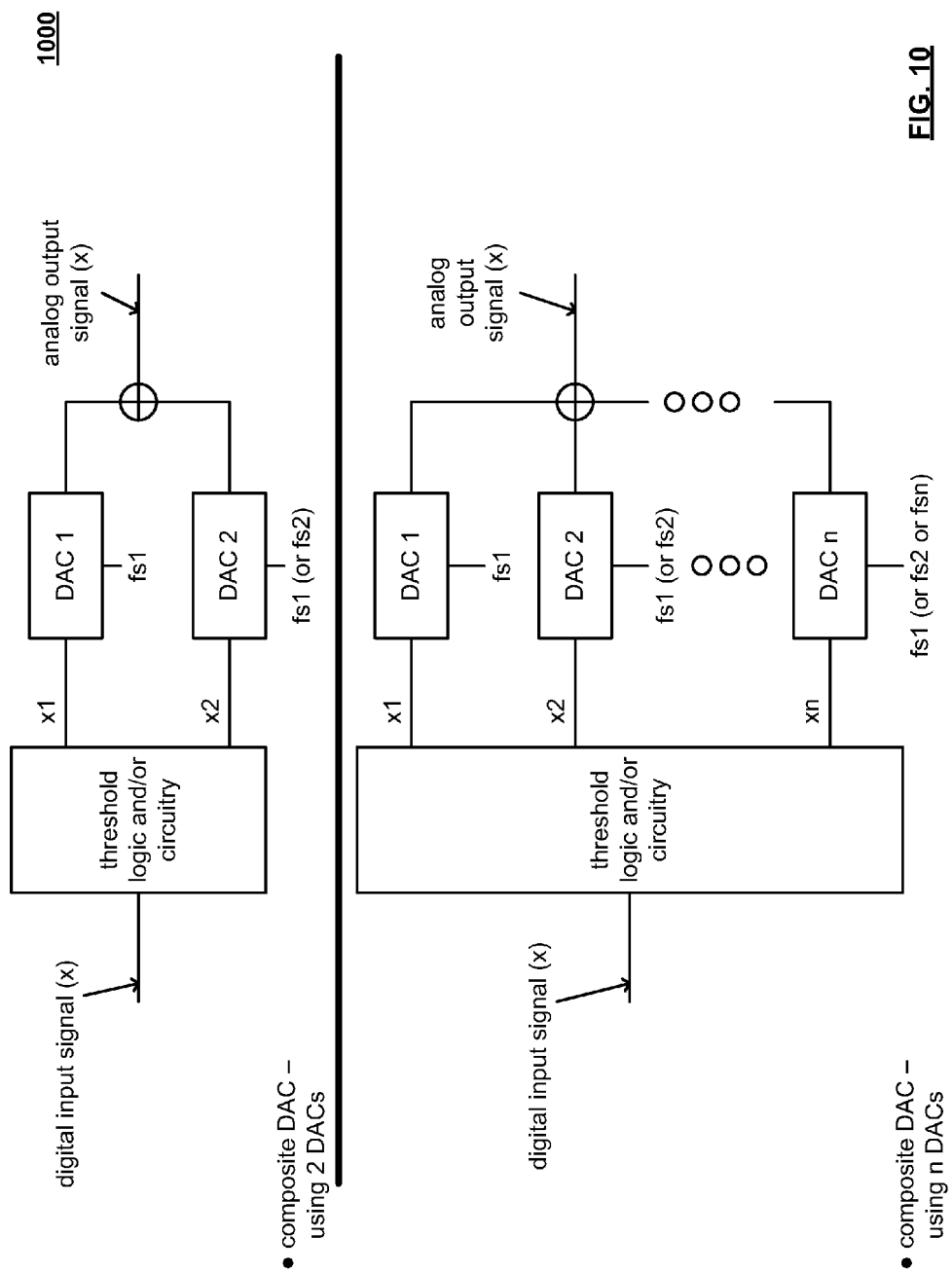
FIG. 10 illustrates embodiments of a composite DAC using 2 DACs and a composite DAC using n DACs.

FIG. 10 illustrates embodiments 1000 of a composite DAC using 2 DACs and a composite DAC using n DACs. In one particular embodiment, the top of this diagram shows a general model of the prior embodiment with only n=2 DACs. The DACs in this diagram may have a common sampling frequency, fs, although the sampling frequencies may differ in other embodiments (e.g., each DAC may operate in accordance with different respective sampling frequencies (e.g., fs1 and fs2)). The digital processing logic of the prior diagram has been replaced by threshold logic (and/or circuitry) in this diagram which indicates when the digital input signal to DAC 1 is outside the input range of DAC 1, and sends the clipped samples (minus the clip level) to DAC2. The threshold logic (and/or circuitry) scales and offsets the clipped samples sent to DAC2 as appropriate to match the characteristics of DAC 1 and DAC2, so as seamlessly to match the outputs of the two DACs into a single composite output. This matching takes into account the number of bits precision in DAC 1 and DAC 2, as well as the voltage gains, offsets and frequency responses of DAC 1 and DAC 2, to provide matching which is as seamless as possible.

In this diagram, the inputs x1 and x2 to DAC1 and DAC2, respectively, are as follows (where x, x1, and x2 are as depicted in the diagram and c is the clip threshold):

$x1=x$ for $x \leq c$;
$x1=c$ for $x>c$; and for
$x \geq 0$.
$x2=0$ for $x \leq c$;
$x2=x-c$ for $x>c$; and for
$x \geq 0$.

It is noted that in all cases $x1+x2=x$, so summing the two DAC outputs (one representing the clipped input, and one representing the clipped peak samples) effectively cancels the clipping.

With respect to such a dual DAC embodiment, when the input to the normal (fine) DAC1 exceeds the clip level, employ auxiliary (coarse) DAC2 to handle the higher range. DAC2 can have low resolution, low power, etc., since it only produces occasional peaks, a small percentage of the duty cycle. DAC2 can be either switched in place of DAC1 or summed with DAC1. In the former case, DAC2 needs to include the clip voltage in its output. In the latter case, DAC2 only outputs the excess over the clip voltage, since DAC1 is saturated at the clip voltage and contributes the required clip voltage level at its output.

In addition, an extension to the dual-DAC method is to approximate the peak with a parabola or other generic pulse waveform with given height and width, as described earlier, and correct the imperfections in the generic pulse waveform by adjusting the values in the fine DAC1. Consider the following example, referring to FIG. 8 for illustration. Assume a generic pulse $q0(n)$, such as a parabola, is used, and its parameters adjusted to produce a pulse $q(n)$ which coarsely fits the actual clipped peak $p(n)$ shown in FIG. 8. The samples applied to fine DAC1 may be modified to equal $p(n)-q(n)$, that is, the difference between the desired peak and the approximate peak. The coarse DAC2 outputs the generic signal $q(n)$, a parabola. At the output of the composite DAC, the coarse and fine DACs are summed, yielding $p(n)-q(n)+q(n)=p(n)$, which is the correct desired output. In this way, the coarse nature of DAC2 is corrected by the fine resolution of DAC1, and the composite DAC output produces the fine resolution.

In a single DAC embodiment, on each sample where the DAC is going to clip (e.g., which may be known in advance since the input is digital), the digital input samples may be scaled by 1/g and its output gain increased by g. This is analogous to a composite ADC using one ADC. It produces lower resolution in the peaks, but provided much better performance than clipping.

Generally speaking, with respect to rollover operation, when a DAC input exceeds the clip level, allow it to roll over instead of saturating. The least significant bits (LSBs) at the DAC input will produce a valid LSB output voltage. A clip voltage may be added to the DAC output. The sum of clip voltage (coarse) and LSBs (fine) gives correct value. This approach with 1 extra range bit allows the DAC to continue operating linearly for twice (or even more) its normal range (e.g., 6 dB range extension). With this approach, an auxiliary DAC2 may not be needed, and a fixed current or voltage at the clip level may be generated that can be added to the DAC1 output when it rolls over. Also, such an approach may be extended to more bits by using a 2-bit or more auxiliary DAC instead of the constant clip level voltage source.

Figure 11:
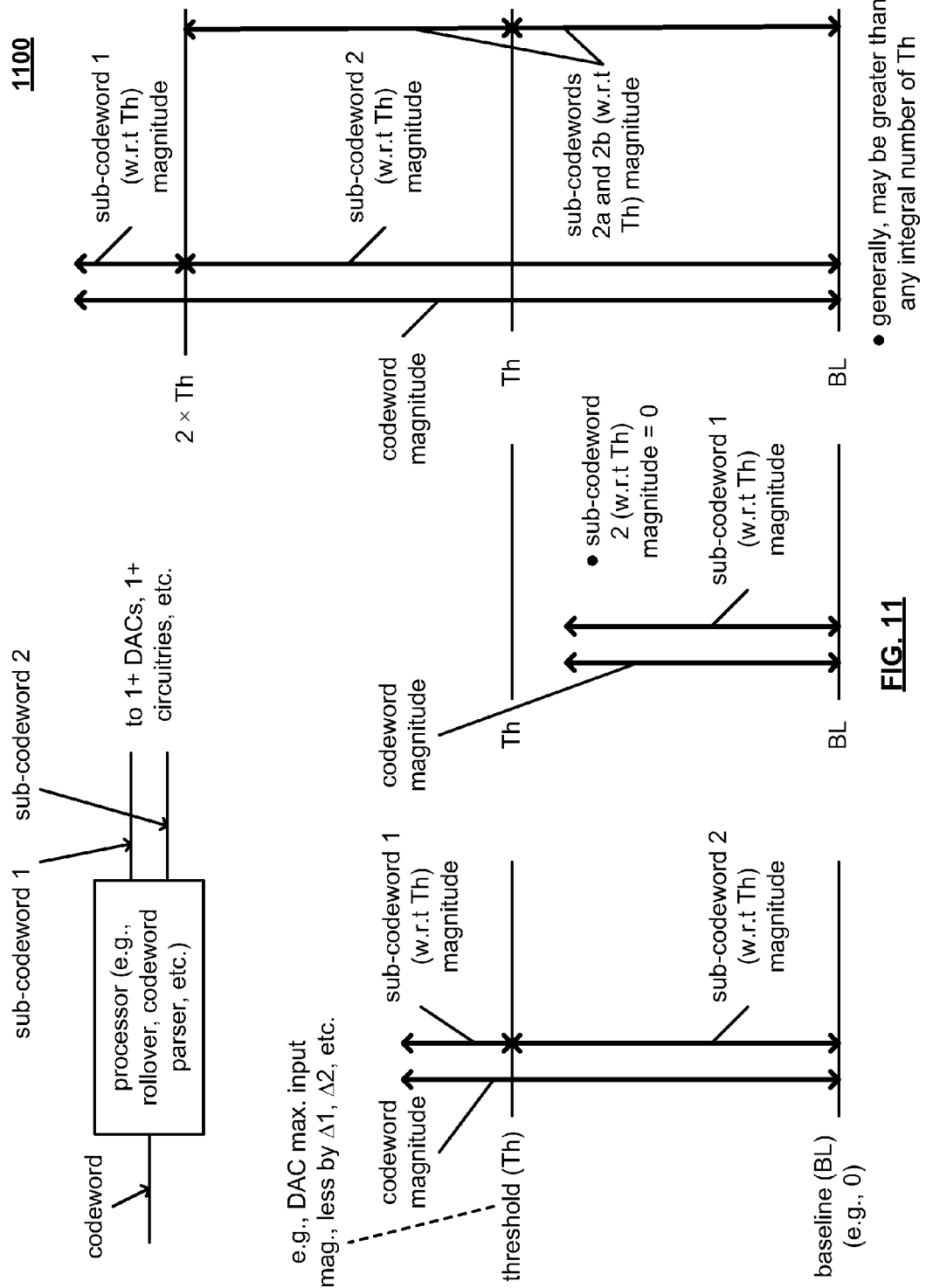
FIG. 11 illustrates an embodiment of codeword processing in accordance with generating 2 or more codewords.

FIG. 11 illustrates an embodiment 1100 of codeword processing in accordance with generating 2 or more codewords. As may be seen with respect to this diagram, processor (e.g., such as a processing module, circuitry, etc.) is operative to partition a codeword into two or more respective sub-codewords which then get provided to one or more DAC's, one or more circuitry is, etc. The processor is operative to compare the codeword magnitude to one or more respective thresholds. Such a threshold may correspond to a maximum input magnitude of a DAC, a value that is close to an maximum input magnitude of the DAC, etc. Generally speaking, such a threshold for comparison to codewords may be based on any of a number of criteria. For example, while a maximum input magnitude of the DAC may be appropriate in one instance, ensuring that no value is provided to a DAC within a certain tolerance or within a certain distance to a maximum input magnitude of the DAC may be appropriate (e.g., such a threshold may be less than the maximum input magnitude of the DAC by some desired amount, which may be a predetermined amount, and adaptively determined amount, etc.). With respect to this diagram, one threshold is shown such that a codeword magnitude is compared thereto. Looking at the lower left portion of the diagram, the codeword magnitude exceeds the threshold. Since the codeword magnitude exceeds a threshold, a first sub-codeword may be generated that corresponds to the portion of the codeword magnitude that exceeds the threshold, and a second sub-codeword may be generated that corresponds to that particular threshold. Of course, alternative embodiments may be designed such that when a codeword magnitude exceeds a given threshold, one of the codewords (e.g., the second sub-codeword) may particularly be tailored to be less than or greater than the threshold by a certain amount, and another of the sub-codewords (e.g., the first sub-codeword) will correspond to the remainder of the codeword magnitude that has not been covered by the second sub-codeword.

Looking at the lower middle portion of the diagram, it can be seen that when a codeword magnitude is less than the threshold, that codeword may be provided directly to a DAC and/or circuitry. In considering such a codeword is being partitioned into two or more sub-codewords, a first of the sub-codewords may be viewed as being the original codeword itself, and a second sub-codeword may be viewed as being a sub-codeword with magnitude of 0.

Looking at the lower right-hand portion of the diagram, it can be seen that when a codeword magnitude is more than an integral number larger than the threshold, two or more respective sub-codewords may be generated. For example, one of the sub-codewords may be that portion of the original codeword that exceeds the integer multiple of the threshold (or alternatively, exceeds a multiple of the threshold), and another of the sub-codewords may correspond to the multiple or integer multiple of the threshold. In another embodiment, a first of the sub-codewords may be that portion of the original codeword that exceeds the multiple or integer multiple of the threshold, and two or more respective other sub-codewords may correspond to the threshold itself (e.g., such that each respective one of these two or more respective other sub-codewords is a multiple or an integer multiple of one of the threshold).

Generally speaking, as described elsewhere herein with respect other embodiments and/or diagrams, information regarding overshoot with respect to a codeword to be provided to a DAC is known with precision, in that, such information exists within the digital domain before conversion from a discrete-time signal to a continuous-time signal (e.g., conversion from the digital domain to the analog domain). Because such information is known beforehand, appropriate handling and processing of such overshoot or over magnitude information related to a codeword in comparison to the maximum input magnitude of the DAC may be appropriately handled.

Figure 12:
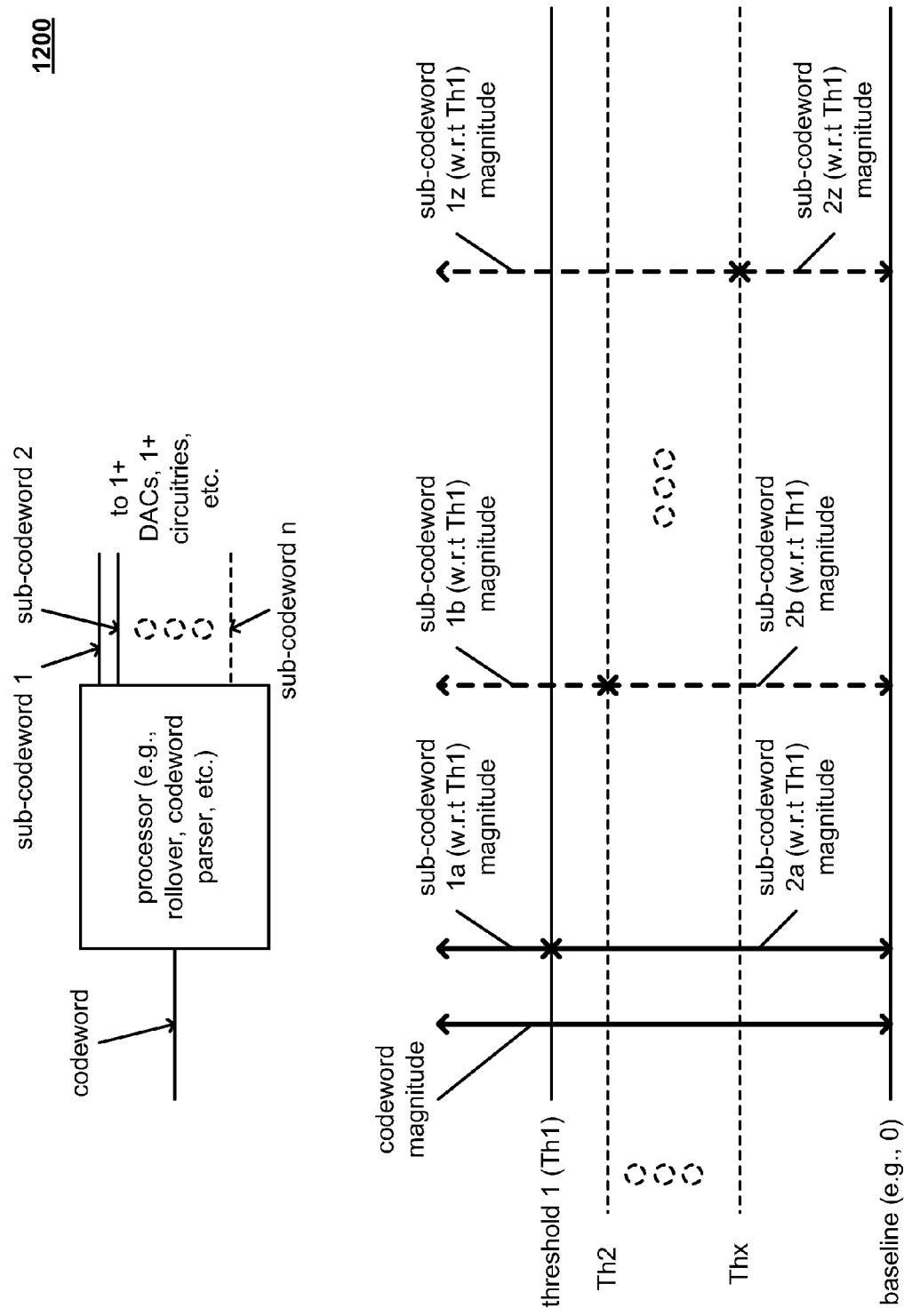
FIG. 12 illustrates an alternative embodiment of codeword processing in accordance with generating 2 or more codewords.

FIG. 12 illustrates an alternative embodiment 1200 of codeword processing in accordance with generating 2 or more codewords. As may be seen with respect to this diagram, more than two respective sub-codewords may be generated by a given codeword. Moreover, a given codeword may be compared to more than one respective threshold. There may be instances in which multiple comparisons are made with respect to multiple respective thresholds in accordance with generating different respective options and sets of sub-codewords from an input or original codeword. In accordance with certain adaptation as may be performed in accordance with various considerations and/or characteristics (e.g., such as in accordance with one or more local considerations, one or more remote considerations, etc.), different respective options and sets of sub-codewords may be generated and relatively compared with respect to one another in view of such considerations and/or characteristics, and a relatively more optimal or ideal solution or set of sub-codewords is employed in a given instance. That is to say, such determination of different respective options and sets of sub-codewords may be performed in parallel and/or simultaneously with respect to one another, and in view of any of a number of considerations, one of those options/sets of sub-codewords may be selected for use.

Generally speaking, in accordance with rollover operation, generation of two or more respective sub-codewords from an input or original codeword allows for the respective driving and operation of at least one DAC and at least one additional circuitry (e.g., which may itself be one or more DAC's, other circuitry or circuitries, etc.).

Moreover, it is noted that any one or more of the respective thresholds to which an input codeword undergoes comparison may be adapted, updated, modified, etc. as a function of time and/or based on any of a number of considerations enter characteristics. For example, in accordance with one or more local considerations, one or more remote considerations, etc., the respective values of one or more of these thresholds may be modified or changed for use in subsequent comparison to one or more subsequently received codewords. Generally speaking, such a system may be viewed as being a dynamic system in which not only are different respective codewords received and undergoing partitioning or parsing into different respective sub-codewords, but the respective comparisons made with respect to one or more thresholds may also be dynamic, in that, the respective values of those thresholds may change over time. Also, such connectivity between such a processor that provides respective sub-codewords to one or more DAC's and one or more different circuitries may undergo modification of connectivity. That is to say, in accordance with a first operating condition or conditions, connectivity from the processor may be made to a first DAC and/or a first one or more other circuitries, while in accordance with a second operating condition or conditions, connectivity from the processor may be made to a second DAC and/or a second one or more other circuitries. That is to say, not only may partitioning and/or parsing of a codeword into respective sub-codewords to be provided to different types of circuitries be made dynamically in accordance with such adaptation, but connectivity between such a processor performing such partitioning and/or parsing operations and those other circuitries (e.g., DAC's, circuitries, etc.).

Figure 13:
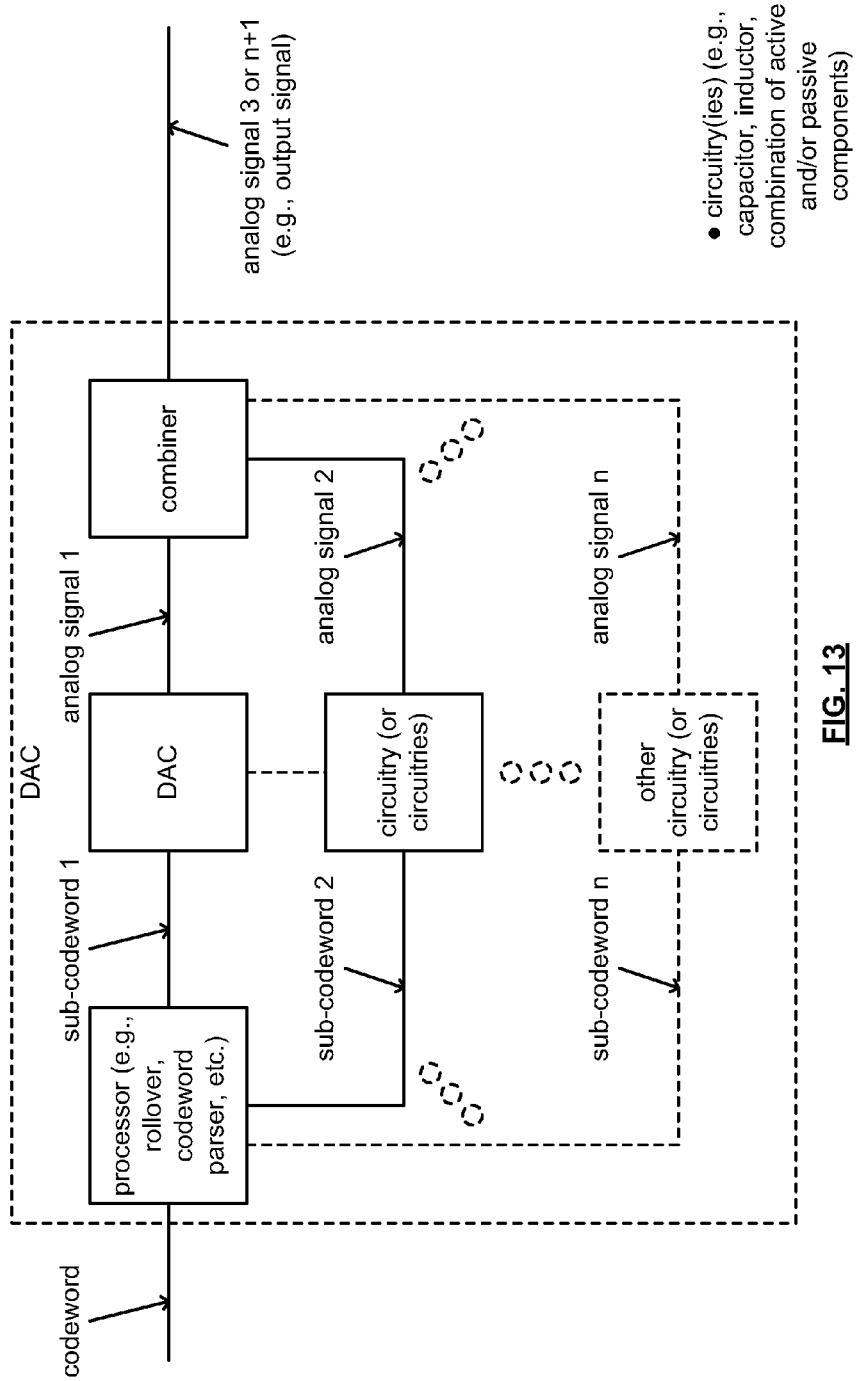
FIG. 13 illustrates an embodiment of an architecture including at least one DAC and at least one additional circuitry (or circuitries).

FIG. 13 illustrates an embodiment 1300 of an architecture including at least one DAC and at least one additional circuitry (or circuitries). As may be seen with respect to this diagram, a processor provides two or more respective sub-codewords to a DAC and at least one other circuitry or circuitries. Generally speaking, any of a number of different respective circuitries may be implemented in conjunction with a given DAC. Each respective circuitry, including the DAC, outputs a respective analog signal based upon the sub-codeword provided thereto. A combiner is operative to combine each of the respective analog signals that it receives in accordance with generating a combined analog signal, which may be referred to as an output signal at least with respect to the operation of this DAC. It is also noted that, with respect to this diagram and embodiment as well as with respect others, and overall DAC may be viewed as including at least one DAC therein as well as other components such as one or more processors, one or more circuitries, one or more combiners, etc.

With respect to the operation of this diagram, that portion of the codeword received by the processor that exceeds at least one threshold corresponds to first sub-codeword to get provided to the DAC. Those one or more portions of the codeword that are less than the at least one threshold correspond to the second, third, and so on sub-codewords the get provided to the other circuitries respectively. That is to say, the DAC may be insured to operate in accordance with a linear operating region given that respective sub-codeword that is provided thereto is less than the at least one threshold to which it is compared.

Figure 14:
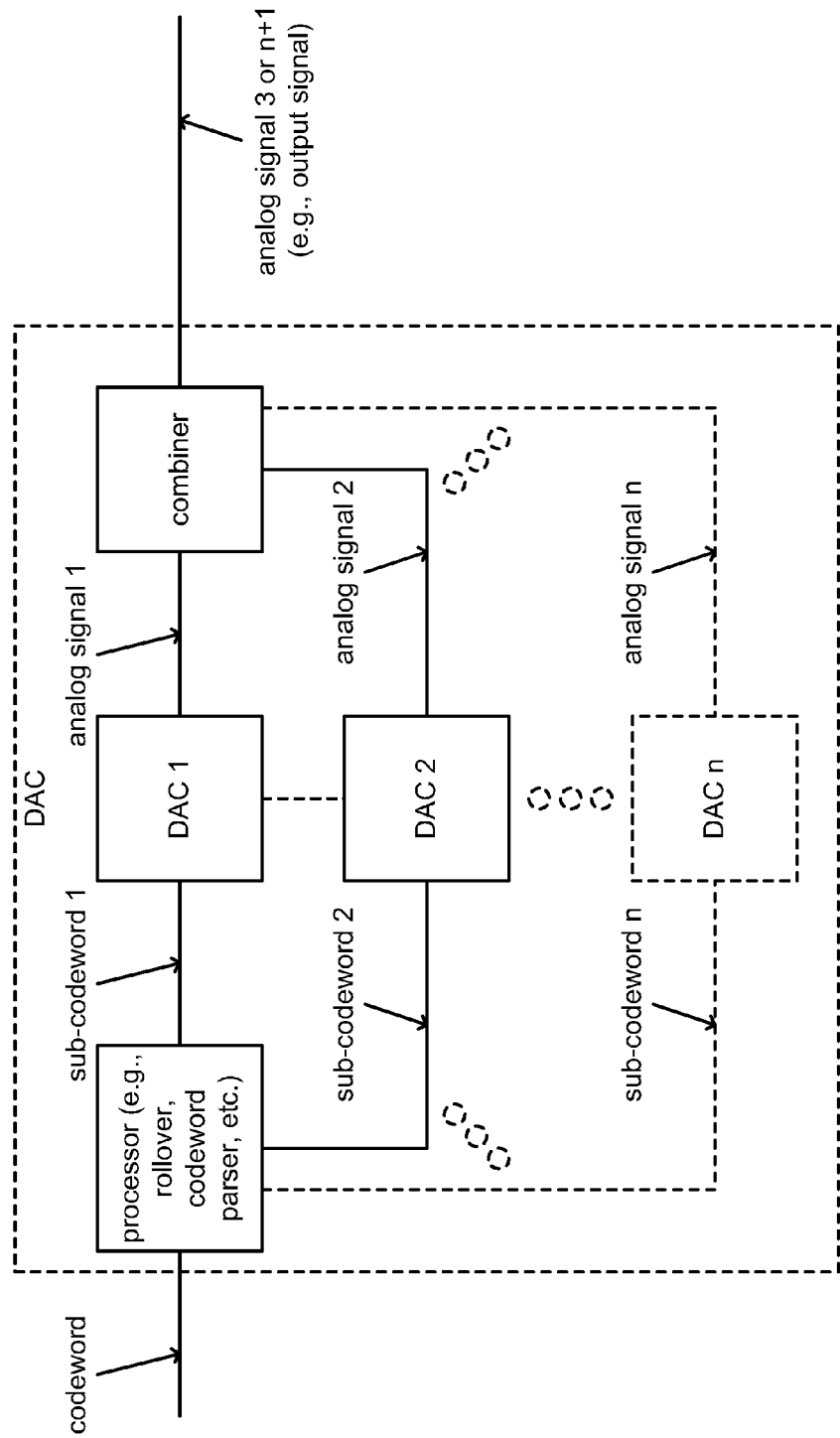
FIG. 14 illustrates an embodiment of an architecture including two or more DACs.

FIG. 14 illustrates an embodiment 1400 of an architecture including two or more DACs. This diagram has some similarities to the previous diagram with at least one difference being that a number of respective DACs are implemented therein. For example, a codeword is partitioned or parsed into two or more respective sub-codeword such that each respective sub-codeword is provided to a respective DAC. Each of the different DAC's may have different operating characteristics including but not limited to, different respective maximum input magnitudes, gains, frequency responses, etc.

Figure 15:
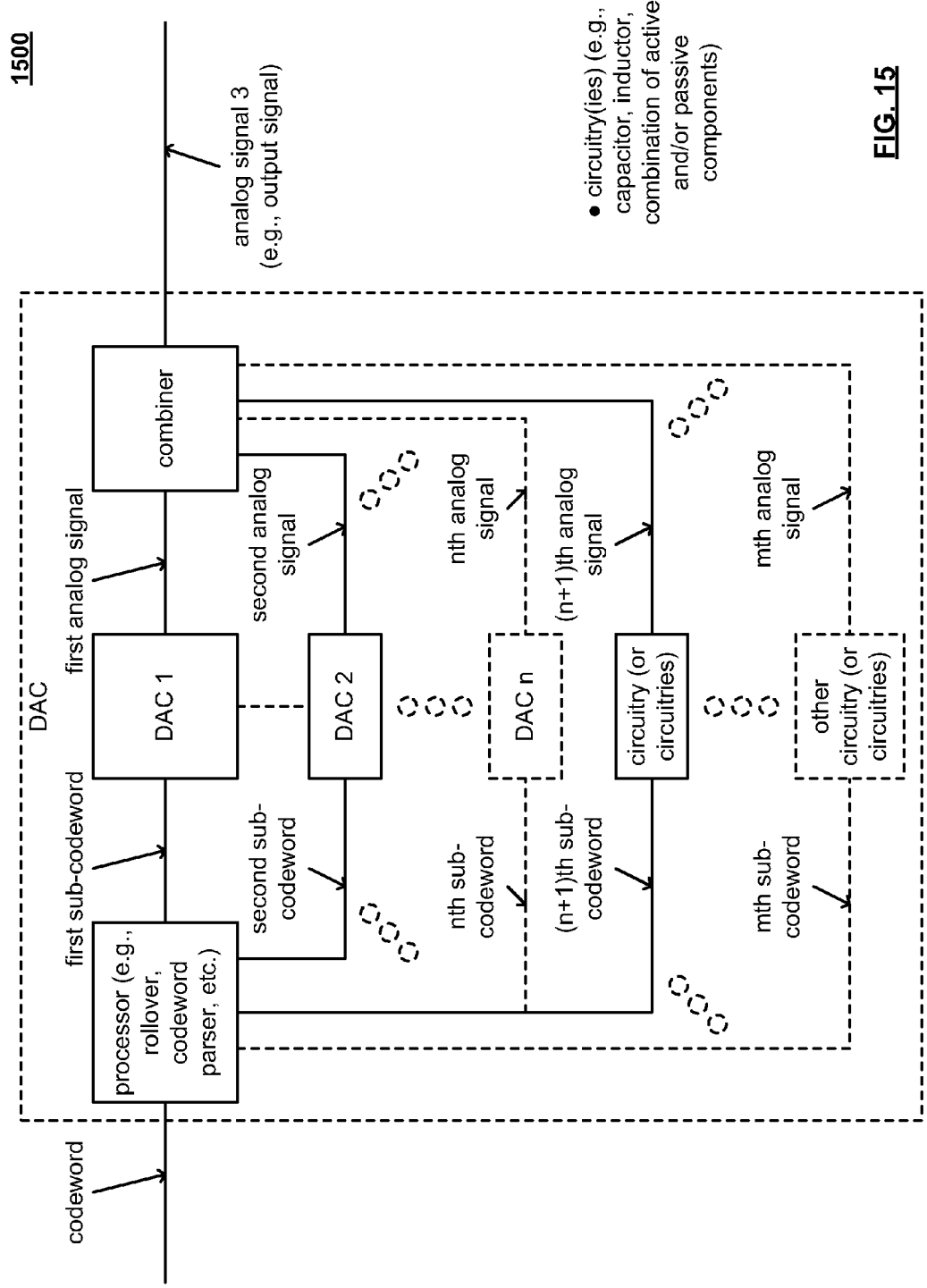
FIG. 15 illustrates an embodiment of an architecture including at two or more DACs and at least one additional circuitry (or circuitries).

FIG. 15 illustrates an embodiment 1500 of an architecture including at two or more DACs and at least one additional circuitry (or circuitries). This diagram generally shows an architecture in which any of a number of different DAC use and any of a number of different circuitry or circuitry is may be implemented for processing different respective sub-codewords as generated from a codeword such as received by a processor. Again, with respect to this architecture as well as with respect others, and overall DAC may be viewed as including a number of DAC's therein (e.g., a number of sub-DAC's therein) as well as any of a number of other circuitries, processors, combiners, etc.

It is also noted that the non-DAC circuitries within a given device may be of any desired form. For example, they may include either one or both of passive component or active component. Certain examples of passive components may include any one or more or combination of inductors, capacitors, resistors, etc. Certain examples of such active component may include any one or more of operational amplifiers, transistors of any desired type, current sources, voltage supplies, etc.

Consideration may be provided with respect to certain non-DAC circuitries such that they may need to operate only a relatively small amount of time (e.g., statistically, such non-DAC circuitries may operate less than a predetermined amount of time). For example, if overshoot or over magnitude of a codeword as received by a DAC occurs only a relatively small amount of time or a relatively small percentage of time, and if some estimation, characterization, etc. of such occurrence is made (e.g., in terms of statistical tracking, etc.), then in appropriately selected or implemented non-DAC circuitry or circuitries may be employed such that such a non-DAC circuitry or circuitries need only be fully operational during those times when an overshoot or over magnitude of a codeword occurs. Considering an example in which a capacitor is employed in such instances, it may take a certain period of time to recharge such a capacitor for subsequent use after it has fully discharged. However, if such a capacitor is only required to deliver such a voltage a relatively small amount or percentage of time (e.g., statistically, such an inductor may operate less than a predetermined amount of time during), then the capacitor may be provided an adequate and sufficient time to recharge before a subsequent use in which it must provide a voltage in view of an overshoot or over magnitude of a codeword as received by a DAC. As such, a relatively inexpensive and relatively low complexity device may be employed for one or more of the non-DAC circuitries. It's Analogously, considering an example in which at least one inductor is employed in such instances, it may take a certain period for such an inductor to rebuild its current delivering capability after it has fully delivered its stored energy. Again, and analogously, if such an at least one inductor is only required to deliver such occurrence a relatively small amount or percentage of time (e.g., statistically, such an inductor may operate less than a predetermined amount of time during), then the at least one inductor may be provided an adequate and sufficient time before a subsequent use in which it must deliver current in view of an overshoot or over magnitude of a codeword as received by a DAC.

Figure 16:
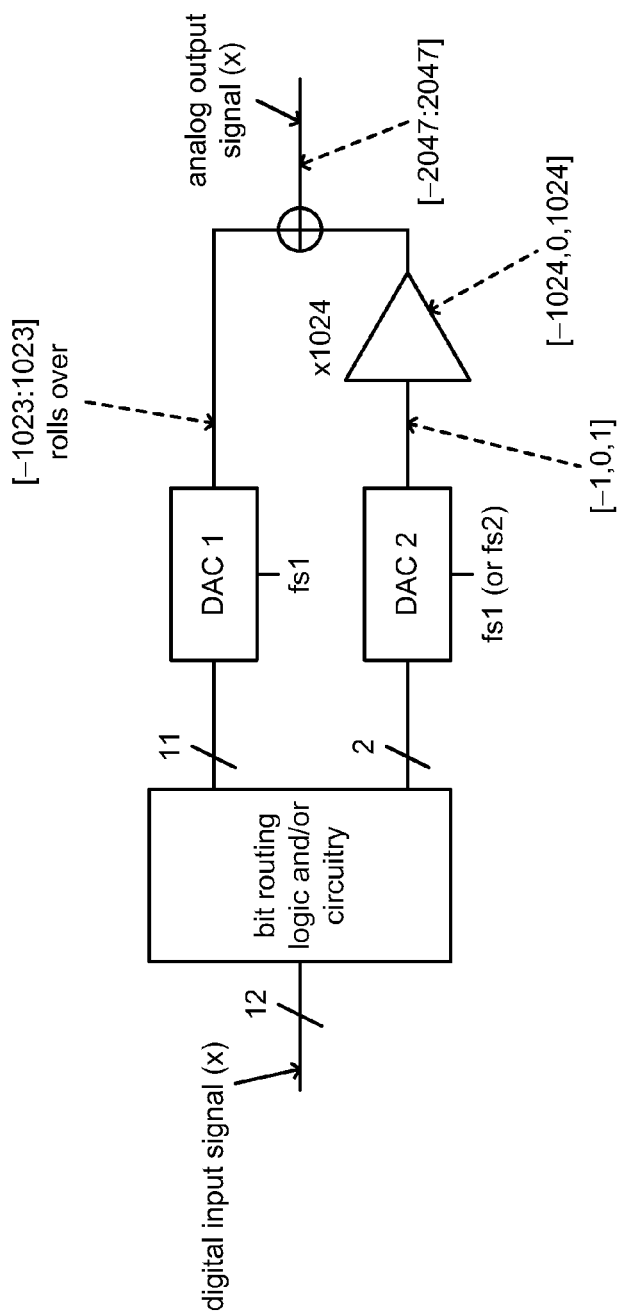
FIG. 16 illustrates an embodiment of a composite DAC that is rollover operative.

FIG. 16 illustrates an embodiment 1600 of a composite DAC that is rollover operative. Herein, some additional block diagram descriptions are provided with more detail on the implementation of various devices that may include one or more DACs. In these diagrams, the gain of a given DAC may be viewed as being 1. That is, the input level (in digital numerical units) and output level (in millivolts or other analog unit) are numerically equal. For example, an input numerical code of 255 produces an output of 255 mV. This choice scaling is illustrative only and for use in illustration to the reader, although it is understood that any other scaling may alternatively be applied in various embodiments.

This diagram shows a composite DAC implemented using the rollover method. The illustrative example shown is for a 12-bit composite DAC constructed from an 11-bit main DAC (DAC 1) and a simple 2-bit, 3-level auxiliary DAC (DAC 2).

The digital input signal enters at the left of the diagram. The bit routing logic sends the 11 MSBs to DAC 1, encoded using positive and negative current or voltage sources as described with respect to ternary (or tri-state) DAC operation herein. When the input signal is outside the 11-bit range of DAC 1, DAC 1 is allowed to roll over; no saturation or clipping logic is applied at its input; hence the name "rollover method". DAC 2 provides only 3 levels: −1, 0, and 1. The level 0 is applied to DAC 2 when the 12-bit input signal is in its normal range (not causing DAC 1 to roll over). The value 1 is applied to DAC 2 when DAC 1 rolls over in the positive direction. The value −1 is applied to DAC 2 when DAC 1 rolls over in the negative direction. The output of DAC 2 is scaled by the factor 1024, so that the effective levels contributed by DAC 2 are −1024, 0, and 1024. The sum of DAC 1 and DAC 2 therefore covers the range from −2047 to 2047 seamlessly, in steps of 1. With such an approximate Gaussian input, and backoff of the 12-bit input signal such that DAC 1 rarely rolls over, DAC 2 will output 0 most of the time, occasionally putting out a low-duty-cycle pulse of value 1024 or −1024 when DAC 1 rolls over in the positive or negative direction, respectively.

Figure 17:
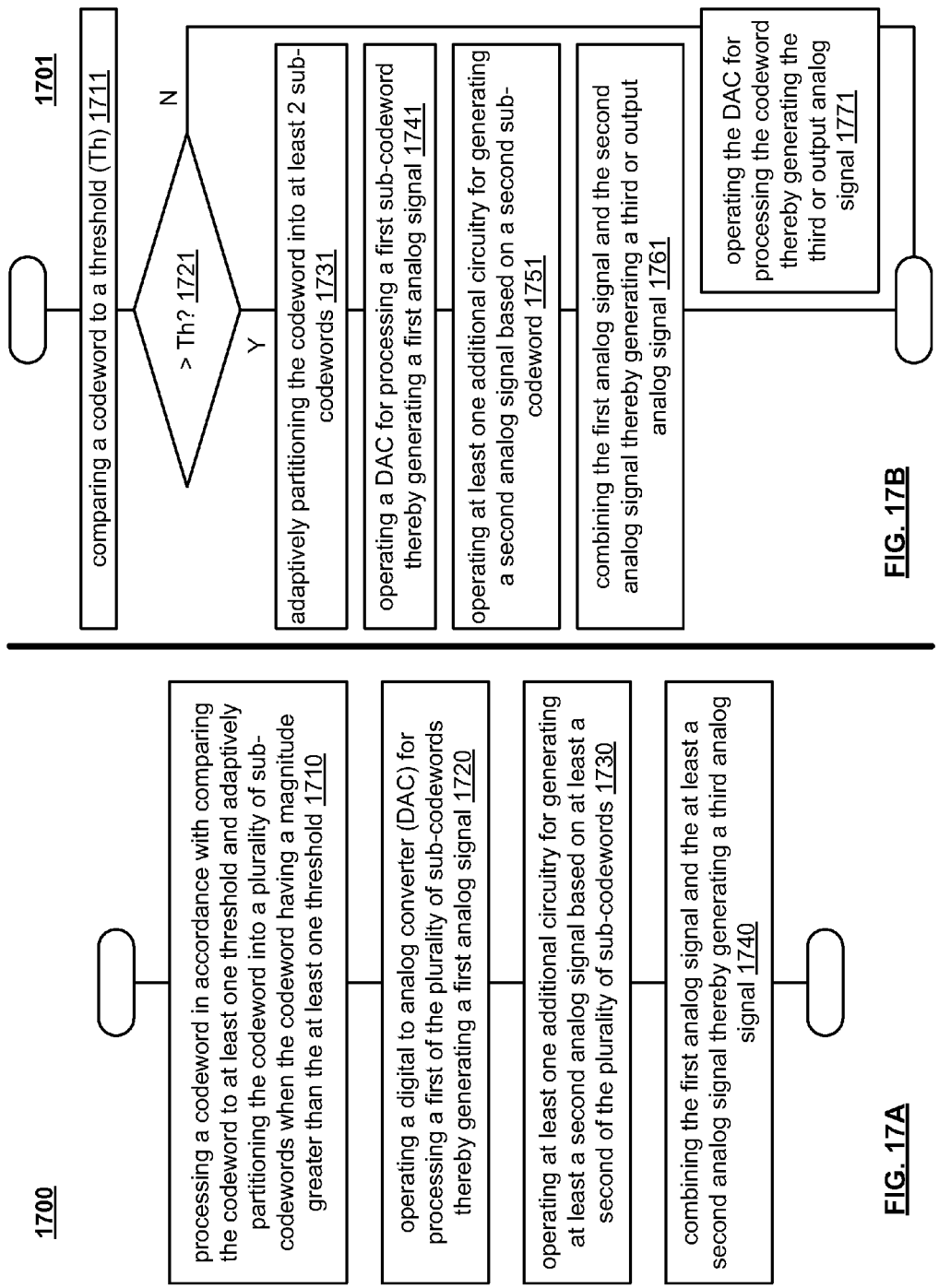
FIG. 17A and FIG. 17B illustrate various embodiments of methods for operating one or more communication devices or devices including one or more DACs.

FIG. 17A and FIG. 17B illustrate various embodiments of methods for operating one or more communication devices or devices including one or more DACs. Generally speaking, the embodiments of the methods of these two diagrams may generally be viewed as relating to, though not limited to, a rollover operative DAC.

Referring to method 1700 of FIG. 17A, the method 1700 begins by processing a codeword in accordance with comparing the codeword to at least one threshold and adaptively partitioning the codeword into a plurality of sub-codewords when the codeword having a magnitude greater than the at least one threshold, as shown in a block 1710. As may be understood with respect to other diagrams and/or embodiments herein, such a codeword may undergo comparison with respect to multiple respective thresholds in certain embodiments. At least one sub-codeword, which may be the original codeword, is provided to a DAC. In instances in which any additional nonzero valued sub-codewords are identified in accordance with the comparison of the codeword with at least one threshold, the one or more additional nonzero valued sub-codewords are provided to at least one of at least one additional DAC, at least one additional circuitry, etc.

The method 1700 continues by operating a digital to analog converter (DAC) for processing a first of the plurality of sub-codewords thereby generating a first analog signal, as shown in a block 1720. Such a DAC that operates in accordance with a first of the plurality of sub-codewords may be viewed generally as being a main DAC within certain embodiments and from certain perspectives.

The method 1700 then operates by operating at least one additional circuitry for generating at least a second analog signal based on at least a second of the plurality of sub-codewords, as shown in a block 1730. Such at least one additional cost circuitry that operates in accordance with a second of the plurality of sub-codewords may be viewed generally as being an auxiliary DAC and/or an auxiliary circuitry is in certain embodiments of from certain perspectives. Again, as may be understood with respect other embodiments and/or diagrams, such and at least one additional circuitry may be implemented using any of a variety of designs including one or more passive components, active components, DAC's, and/or any combination thereof, etc.

The method 1700 continues by combining the first analog signal and the at least a second analog signal thereby generating a third analog signal, as shown in a block 1740.

Referring to method 1701 of FIG. 17B, the method 1701 begins by comparing a codeword to a threshold, as shown in a block 1711. The method 1701 then operates by determining whether or not the codeword compares favorably or unfavorably with respect to the threshold. When the codeword does not compare favorably to the threshold, such as the codeword magnitude is less than the threshold (e.g., or alternatively equal to the threshold), the method 1701 continues by operating a DAC for processing the codeword thereby generating an output analog signal, as shown in a block 1771.

However, when the codeword does compare favorably to the threshold, such as the covert magnitude being greater than the threshold, as shown in a block 1721, the method 1701 continues by adaptively partitioning the codeword into at least two sub-codewords, as shown in a block 1731.

The method 1701 then operates by operating a DAC for processing a first sub-codeword thereby generating a first analog signal, as shown in a block 1741. The method 1701 continues by operating at least one additional circuitry for generating a second analog signal based on a second sub-codeword, as shown in a block 1751. Again, as described elsewhere herein, such an at least one additional circuitry may be implemented in any of a variety of ways including one or more passive components, active components, DAC's, and/or any combination thereof, etc., as described elsewhere herein.

The method 1701 then operates by combining the first analog signal and the second analog signal thereby generating a third analog signal (e.g., which may be viewed as being an output analog signal), as shown in a block 1761.

Figure 18:
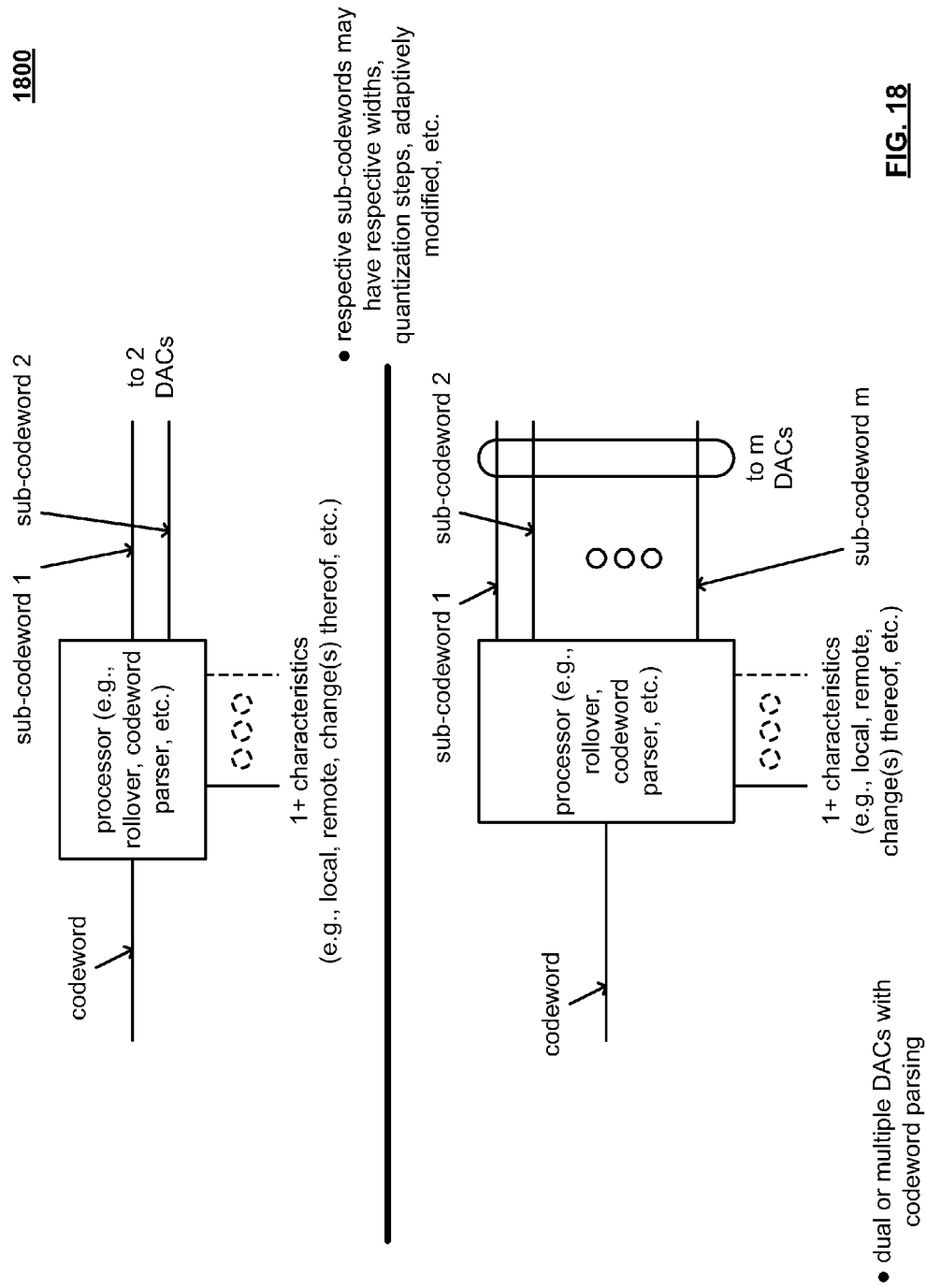
FIG. 18 illustrates various embodiments of codeword processing in accordance with generating 2 or more codewords based on one or more characteristics associated with one or more devices and/or systems.

FIG. 18 illustrates various embodiments 1800 of codeword processing in accordance with generating 2 or more codewords based on one or more characteristics associated with one or more devices and/or systems. Generally speaking, consideration with respect to one or more characteristics may be employed in accordance with driving the parsing or partitioning of a codeword into two or more respective sub-codewords. For example, such considerations may be made with respect to local characteristics, remote characteristics, and/or changes associated with either one or both of such local and remote characteristics, etc.

Generally, operation of any one or more processors, modules, circuitries, processes, steps, etc. within such a device may be adaptively made based upon consideration associated with local operational parameters and/or remote operational parameters. Examples of local operational parameters may be viewed as corresponding to provisioned and/or currently available hardware, processing resources, memory, etc. Examples of remote operational parameters may be viewed as corresponding to characteristics associated with respective communications, including delivery or output communications and/or source or input communications, corresponding to signaling which is received from and/or transmitted to one or more other devices, including source devices and or destination devices. For example, characteristics associated with any communication may be related to any one or more of latency, delay, noise, distortion, crosstalk, attenuation, signal to noise ratio (SNR), capacity, bandwidth, frequency spectrum, bit rate, symbol rate associated with the at least one source or input communication, and/or any other characteristic, etc. Considering another example, characteristics associated with any communication may be related more particularly to a given device from which or through which such a communication may pass including any one or more of user usage information, processing history, queuing, an energy constraint, a display size, a display resolution, a display history associated with the device, and/or any other characteristic, etc. Moreover, various signaling may be provided between respective devices in addition to signaling of communications. That is to say, various feedback or control signals may be provided between respective devices within such a communication system.

With respect to the bottom portion of the diagram, it may be seen that any of a number of different sub-codewords may be generated from a receiver input codeword. That is to say, more than two respective sub-codewords may be generated from a codeword. Consideration with respect to such partitioning or parsing of a codeword into respective sub-codewords may be made based upon one or more characteristics (e.g., whether they be local, remote, changes thereof, etc.). Such parsing and or partitioning performed in accordance with such adaptation and with respect to differently generated sub-codewords with respect to different respective codewords may be made in terms of any one or more of a variety of characteristics, including sub-codeword width (e.g., the number of bits included within a sub-codeword), quantization steps, etc. Moreover, such adaptation may be in consideration of any one or more local and/or remote operating characteristics of one or more devices, communication links, etc. within a communication system or network. Different respective sub-codewords undergo processing by different respective DAC's in generating respective analog signals for combination in generating a final or output analog signal.

Figure 19:
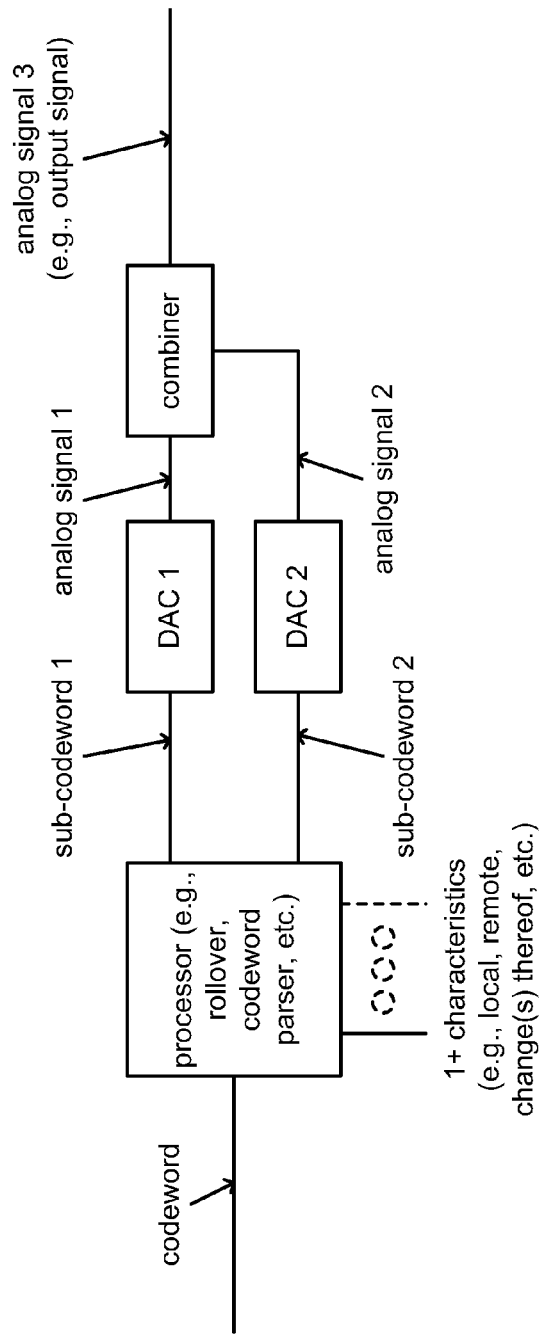
FIG. 19 illustrates an embodiment of an architecture operative for performing codeword processing in accordance with generating 2 or more codewords based on one or more characteristics associated with one or more devices and/or systems.

FIG. 19 illustrates an embodiment 1900 of an architecture operative for performing codeword processing in accordance with generating 2 or more codewords based on one or more characteristics associated with one or more devices and/or systems.

This diagram generally shows an implementation in which to respective DAC's operate based upon two respective sub-codewords which may be generated by the processor (e.g., generated from the codeword). Each of the respective DAC's generates a respective analog signal that subsequently undergo combination by a combiner thereby generating a combined analog signal, which may be viewed as being an output signal with respect to this architecture. With respect to this diagram as well as with respect others, it is noted that such analog signals as generated by a DAC or another type of circuitry need not necessarily always be positive and value. That is to say, one or more of the respective analog signals generated by a DAC or another circuitry may be negative in value such that, upon combination with other respective analog signal, one or more of the other analog signals is reduced in value generally speaking, the combination of different respective analog signals may be viewed as a combination of respective analog signals that may be positive valued, negative valued, or zero valued. As with respect to other embodiments and/or diagrams herein, consideration with respect to such partitioning or parsing of a codeword into respective sub-codewords may be made based upon one or more characteristics (e.g., whether they be local, remote, changes thereof, etc.).

Figure 20:
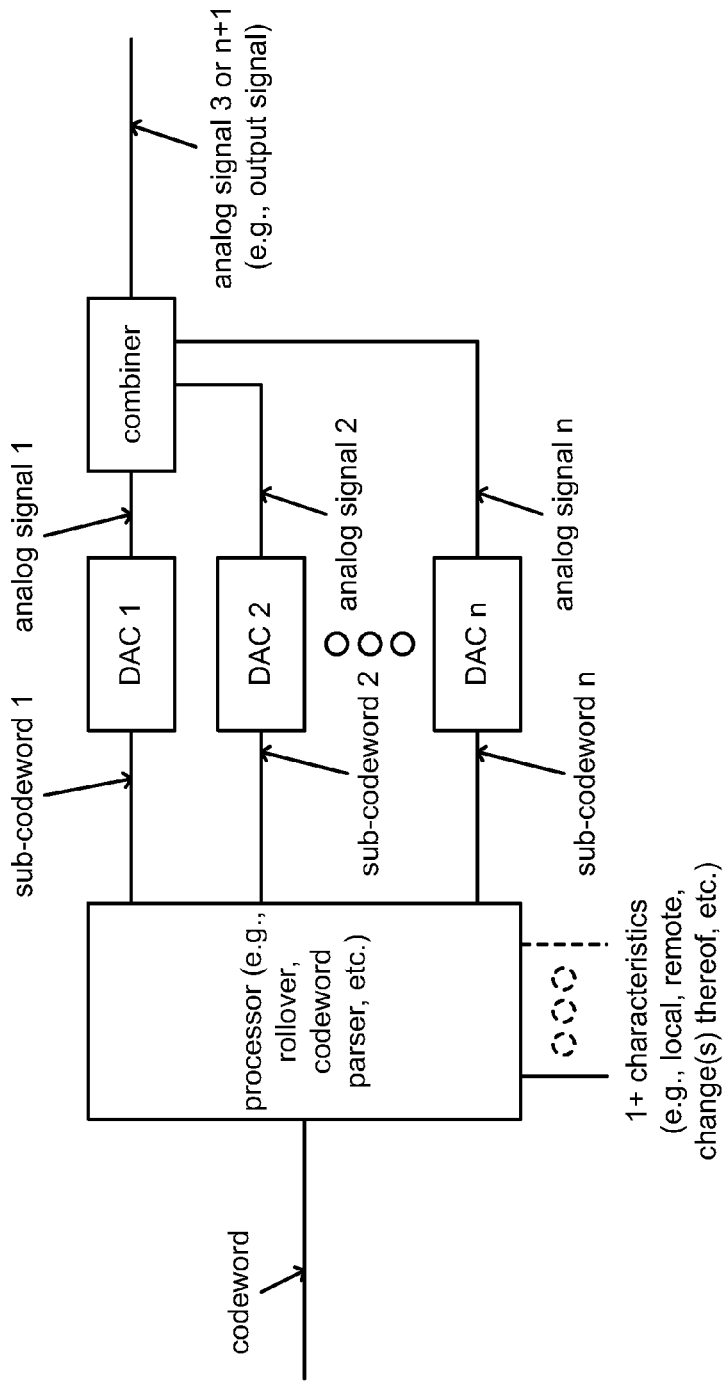
FIG. 20 illustrates an embodiment of an architecture operative for performing codeword processing in accordance with generating n codewords based on one or more characteristics associated with one or more devices and/or systems.

FIG. 20 illustrates an embodiment 2000 of an architecture operative for performing codeword processing in accordance with generating n codewords based on one or more characteristics associated with one or more devices and/or systems.

This diagram generally shows an implementation in which more than two, or generally n DAC's operate based upon respective sub-codewords which may be generated by the processor. Each of the respective DACs generates a respective analog signal, and all of these generated analog signals subsequently undergo combination by combiner thereby generating a combined analog signal, which may be viewed as being an output signal with respect to this architecture. Also, with respect to this diagram as well as with respect others, it is noted that such analog signals as generated by a DAC or another type of circuitry need not necessarily always be positive and value. That is to say, one or more of the respective analog signals generated by a DAC or another circuitry may be negative in value such that, upon combination with other respective analog signal, one or more of the other analog signals is reduced in value generally speaking, the combination of different respective analog signals may be viewed as a combination of respective analog signals that may be positive valued, negative valued, or zero valued.

With respect to certain of the subsequent diagrams, such as FIG. 21, FIG. 22, FIG. 23, and FIG. 24, different respective communication devices implemented within any of a number of different types of communication networks may include one or more DAC's therein. For example, in accordance with a transmitter type communication device and/or a communication device including transmitter capability, conversion from the digital domain to the analog domain is often performed in accordance with generating a signal to be launched into a least one communication link associated with at least one communication network type. For example, a transcoder type device as described within certain of the diagrams herein may include both receiver functionality as well as transmitter functionality. With respect to the receiver functionality, one or more analog to digital converters (ADCs) may be implemented therein. With respect to the transmitter functionality, one or more DAC's name implemented therein. Adaptation with respect to the operation of such devices may be made with respect to any of a number of different characteristics (e.g., whether they be local, remote, changes thereof, etc.).

Figure 21:
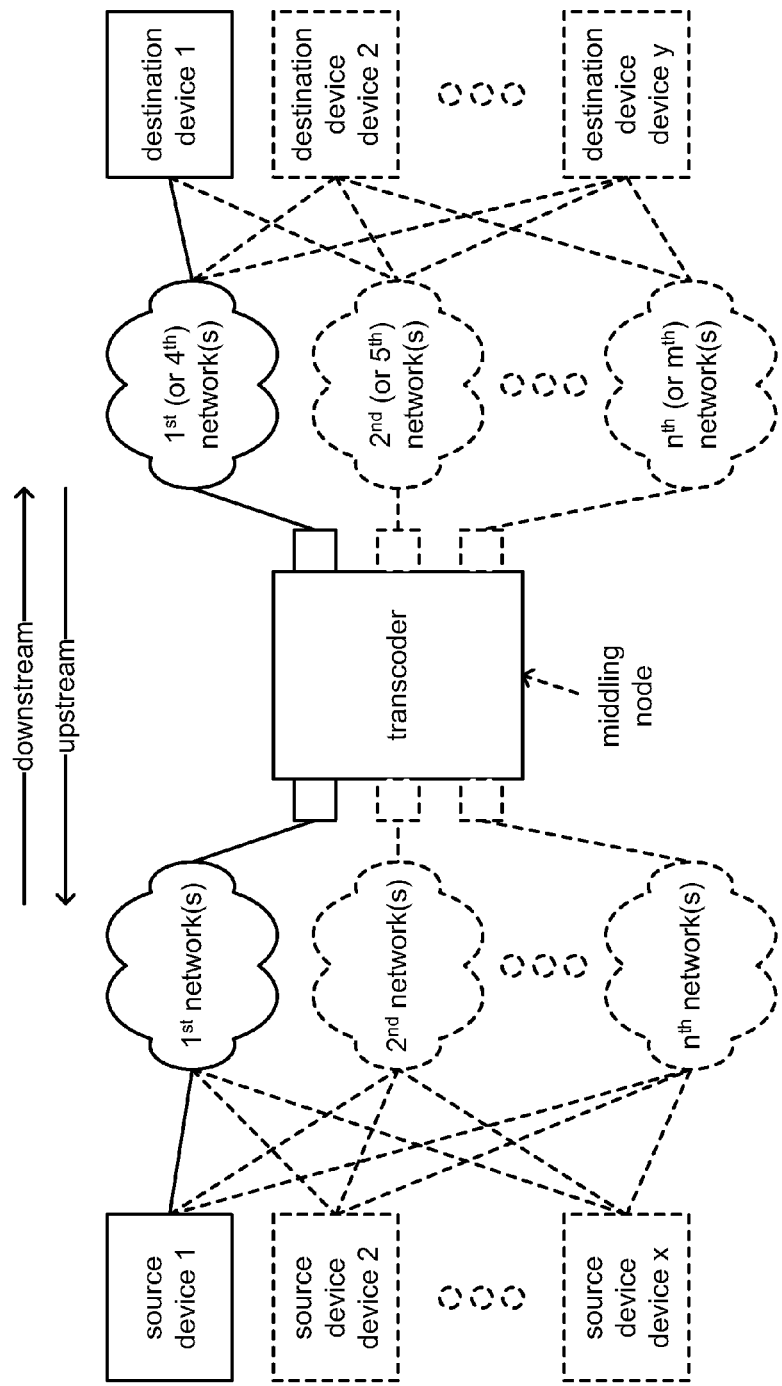
FIG. 21 illustrates an embodiment of a transcoder implemented within a communication system.

FIG. 21 illustrates an embodiment 2100 of a transcoder implemented within a communication system. As may be seen with respect to this diagram, a transcoder may be implemented within a communication system composed of one or more networks, one or more source devices, and/or one or more destination devices. Generally speaking, such a transcoder may be viewed as being a middling device interveningly implemented between at least one source device and at least one destination device as connected and/or coupled via one or more communication links, networks, etc. In certain situations, such a transcoder may be implemented to include multiple inputs and/or multiple outputs for receiving and/or transmitting different respective signals from and/or to one or more other devices.

Operation of any one or more modules, circuitries, processes, steps, etc. within the transcoder may be adaptively made based upon consideration associated with local operational parameters and/or remote operational parameters. Examples of local operational parameters may be viewed as corresponding to provisioned and/or currently available hardware, processing resources, memory, etc. Examples of remote operational parameters may be viewed as corresponding to characteristics associated with respective streaming flows, burst transmissions, packetized communications, etc. (e.g., generally: communications), including delivery communications and/or source communications, corresponding to signaling which is received from and/or transmitted to one or more other devices, including source devices and or destination devices. For example, characteristics associated with any communication may be related to any one or more of latency, delay, noise, distortion, crosstalk, attenuation, signal to noise ratio (SNR), capacity, bandwidth, frequency spectrum, bit rate, symbol rate associated with the at least one source communication, and/or any other characteristic, etc. Considering another example, characteristics associated with any communication may be related more particularly to a given device from which or through which such a communication may pass including any one or more of user usage information, processing history, queuing, an energy constraint, a display size, a display resolution, a display history associated with the device, and/or any other characteristic, etc. Moreover, various signaling may be provided between respective devices in addition to signaling of communications. That is to say, various feedback or control signals may be provided between respective devices within such a communication system.

In at least one embodiment, such a transcoder is implemented for selectively transcoding at least one communication thereby generating at least one transcoded delivery communication based upon one or more characteristics associated with the at least one source communication and/or the at least one transcoder that providing the communication. That is to say, consideration may be performed by considering characteristics associated with communications with respect to an upstream perspective, a downstream perspective, and/or both an upstream and downstream perspective. Based upon these characteristics, including historical information related thereto, current information related thereto, and/or predicted future information related thereto, adaptation of the respective transcoding as performed within the transcoder may be made. Again, consideration may also be made with respect to global operating conditions and/or the current status of operations being performed within the transcoder itself. That is to say, consideration with respect to local operating conditions (e.g., available processing resources, available memory, source or input communication(s) being received, delivery or output communication(s) being transmitted, etc.) may also be used to effectuate adaptation of respective transcoding as performed within the transcoder.

In certain embodiments, adaptation is performed by selecting one particular video coding protocol or standard from among a number of available video coding protocols or standards. If desired, such adaptation may be with respect to selecting one particular profile of a given video coding protocol or standard from among a number of available profiles corresponding to one or more video coding protocols or standards. Alternatively, such adaptation may be made with respect to modifying one or more operational parameters associated with a video coding protocol or standard, a profile thereof, or a subset of operational parameters associated with the video coding protocol or standard.

In other embodiments, adaptation is performed by selecting different respective manners by which video coding may be performed. That is to say, certain video coding, particularly operative in accordance with entropy coding, may be context adaptive, non-context adaptive, operative in accordance with syntax, or operative in accordance with no syntax. Adaptive selection between such operational modes, specifically between context adaptive and non-context adaptive, and with or without syntax, may be made based upon such considerations as described herein.

Generally speaking, with respect to a video or media environment, a real time transcoding environment may be implemented wherein scalable video coding (SVC) operates both upstream and downstream of the transcoder and wherein the transcoder acts to coordinate upstream SVC with downstream SVC. Such coordination involves both internal sharing real time awareness of activities wholly within each of the transcoding decoder and transcoding encoder. This awareness extends to external knowledge gleaned by the transcoding encoder and decoder when evaluating their respective communication PHY/channel performance. Further, such awareness exchange extends to actual feedback received from a downstream presentation device's decoder and PHY, as well as an upstream source encoder and PHY. To fully carry out SVC plus overall flow management, control signaling via industry or proprietary standard channels flow between all three nodes.

Figure 22:
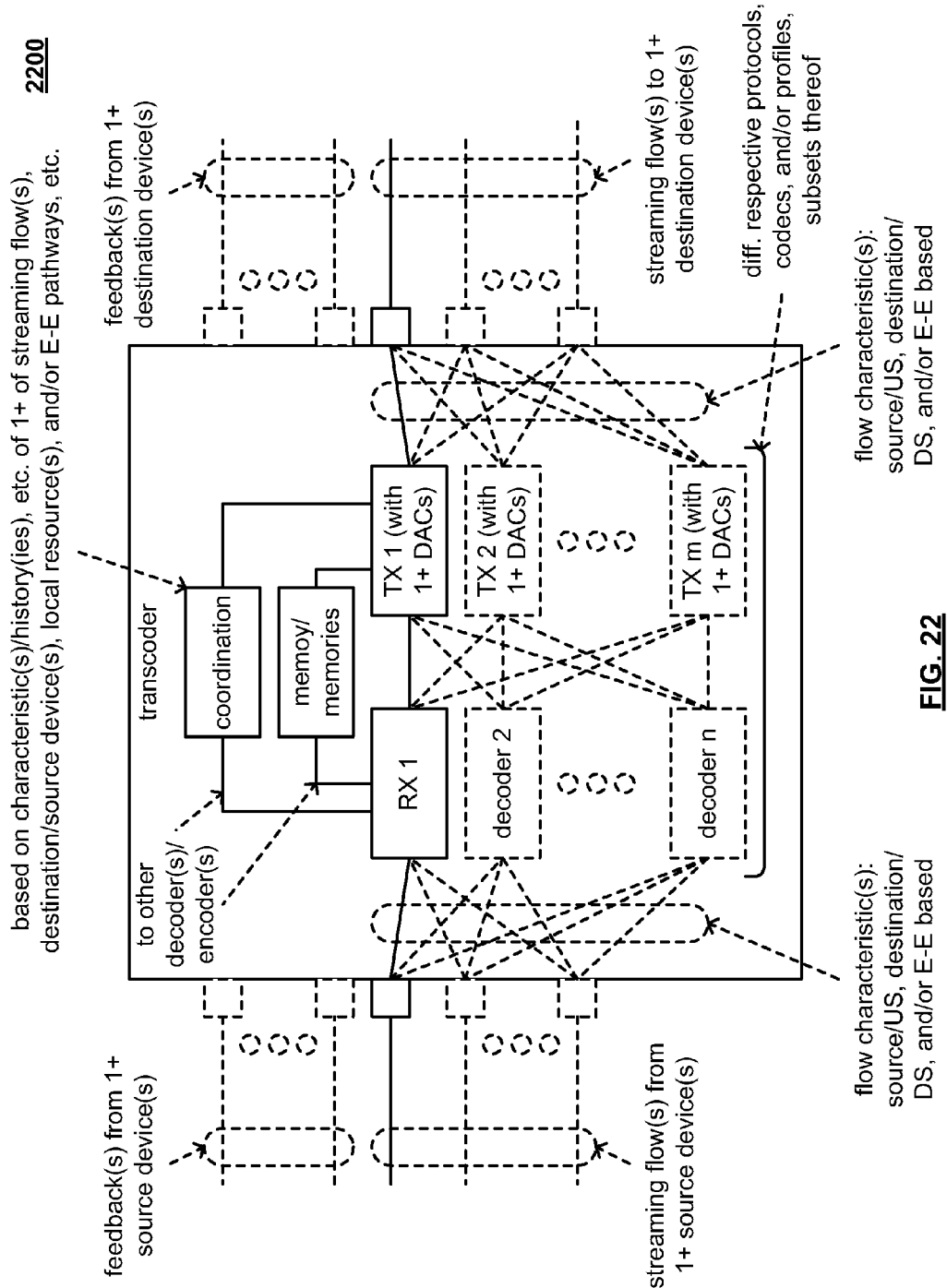
FIG. 22 illustrates an alternative embodiment of a transcoder implemented within a communication system.

FIG. 22 illustrates an alternative embodiment 2200 of a transcoder implemented within a communication system. As can be seen with respect to this diagram, one or more respective decoders and one or more respective and coders may be provisioned each having access to one or more memories and each operating in accordance with coordination based upon any of the various considerations and/or characteristics described herein. For example, characteristics associated with respective streaming communications from one or more source devices, to one or more destination devices, the respective end-to-end pathways between any given source device and any given destination device, feedback and/or control signaling from those source devices/destination devices, local operating considerations, histories, etc. may be used to effectuate adaptive operation of decoding processing and/or encoding processing in accordance with transcoding.

Figure 23:
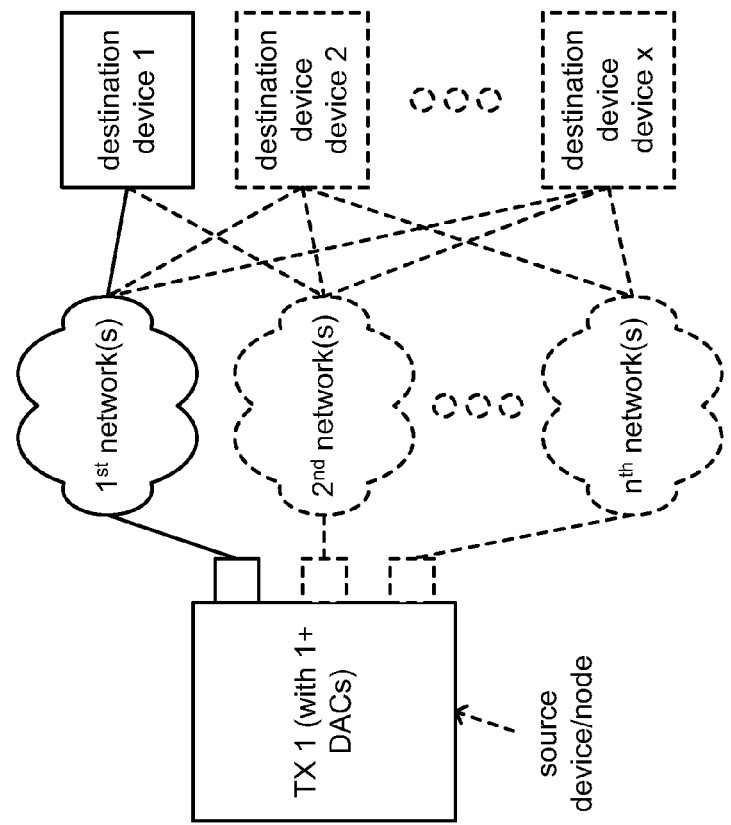
FIG. 23 illustrates an embodiment of an encoder implemented within a communication system.

FIG. 23 illustrates an embodiment 2300 of an encoder implemented within a communication system. As may be seen with respect to this diagram, and encoder may be implemented to generate one or more signals that may be delivered via one or more delivery communications to one or more destination devices via one or more communication networks, links, etc.

As may be analogously understood with respect to the context of transcoding, the corresponding encoding operations performed therein may be applied to a device that does not necessarily performed decoding of received streaming source communications, but is operative to generate streaming delivery communications that may be delivered via one or more delivery communications to one or more destination devices via one or more communication networks, links, etc.

Figure 24:
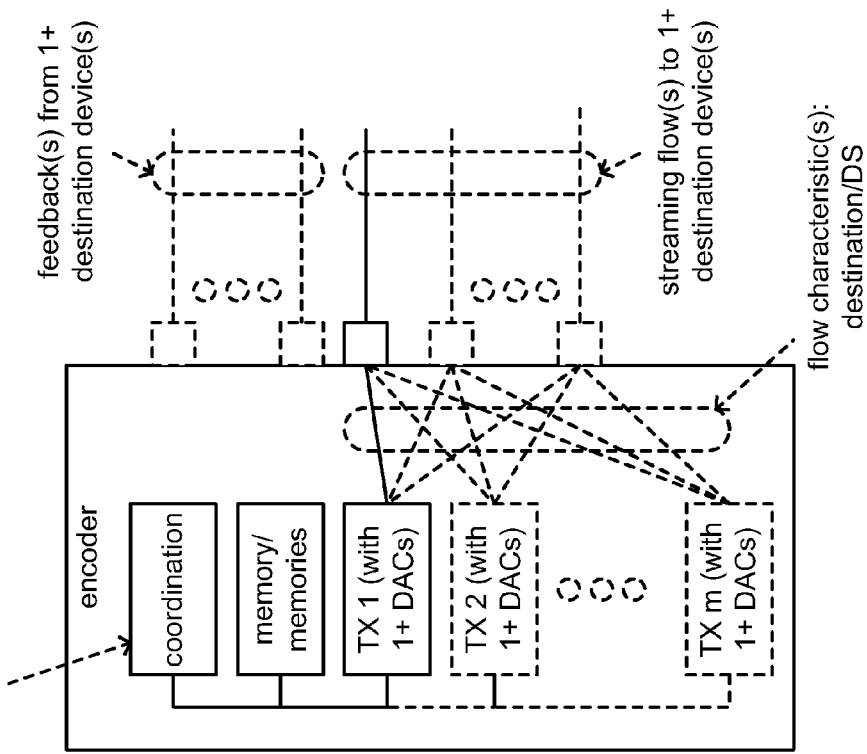
FIG. 24 illustrates an alternative embodiment of an encoder implemented within a communication system.

FIG. 24 illustrates an alternative embodiment 2400 of an encoder implemented within a communication system. As may be seen with respect to this diagram, coordination and adaptation among different respective and coders may be analogously performed within a device implemented for performing encoding as is described elsewhere herein with respect to other diagrams and/or embodiments operative to perform transcoding. That is to say, with respect to an implementation such as depicted within this diagram, adaptation may be effectuated based upon encoding processing and the selection of one encoding over a number of encodings in accordance with any of the characteristics, considerations, whether they be local and/or remote, etc.

FIG. 25A and FIG. 25B illustrate various alternative embodiments of methods for operating one or more communication devices or devices including one or more DACs. Generally speaking, the embodiments of the methods of these two diagrams may generally be viewed as relating to, though not limited to, codeword parsing in regards to providing respective sub-codewords two different respective DAC's within one or more devices.

Referring to method 2500 of FIG. 25A, the method 2500 begins by adaptively partitioning a codeword into a plurality of sub-codewords based on at least one of at least one local operating characteristic, or change thereof, of the device and at least one remote operating characteristic, or change thereof, of at least one additional device in communication with the device via at least one communication network, as shown in a block 2510.

The method 2500 continues by operating a first digital to analog converter (DAC) for processing a first of the plurality of sub-codewords thereby generating a first analog signal, as shown in a block 2520. The method 2500 then operates by operating a second DAC for processing a second of the plurality of sub-codewords thereby generating a second analog signal, as shown in a block 2530. The method 2500 continues by combining the first analog signal and the second analog signal thereby generating a third analog signal, as shown in a block 2540.

Referring to method 2501 of FIG. 25B, the method 2501 begins by adaptively partitioning a first codeword into a first plurality of sub-codewords based on a first at least one characteristic, as shown in a block 2511. The method 2501 then operates by adaptively partitioning a second codeword into a second plurality of sub-codewords based on the first or a second at least one characteristic, as shown in a block 2521. Analogous such operations and processing may be performed with respect to subsequent and/or different codewords in accordance with adaptively partitioning different respective codewords into different respective pluralities of sub-codewords based on one or more characteristics. In certain embodiments, the same or similar characteristics may be employed to drive the different respective adaptive partitioning of codewords. In alternative embodiments, different respective characteristics may be respectively employed to drive the different respective adaptive partitioning codewords. Alternatively, with respect to even other embodiments, certain common characteristics may be employed in accordance with adaptive partitioning of each of the respective codewords and uniquely associated characteristic(s) may also be respectively employed in combination in accordance with the adaptive partitioning of the respective codewords. That is to say, a common one or more characteristic may be used to drive the adaptive partitioning of all respective codewords, and yet one or more individual word uniquely identified characteristics may be respectively applied for the adaptive partitioning of each of the respective codewords.

The method 2501 continues by adaptively partitioning a third codeword into a third plurality of sub-codewords based on the first, the second, or a third at least one characteristic, as shown in a block 2531. Generally speaking, adaptive partitioning of respective codewords may be made in accordance with any of a number of different characteristics thereby generating different respective subsets of sub-codewords that may be provided to different respective circuitries including one or more DAC's, and which may also include one or more other circuitry or circuitries, etc.

Figure 26:
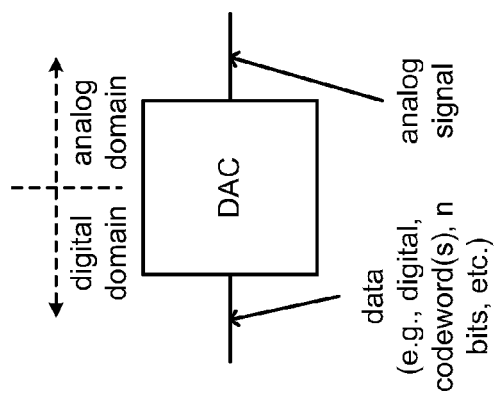
FIG. 26 illustrates an embodiment of DAC encoding in accordance with one or more ternary (or tri-state) devices.

FIG. 26 illustrates an embodiment 2600 of DAC encoding in accordance with one or more ternary (or tri-state) devices. With respect to embodiments operative for exploiting input signal distribution, characteristics, probability density function (PDF), etc., such operation may be better than adding another bit to the DAC (e.g., adding one more current source at the MSB end). Such an embodiment may operate by exploiting the approximately Gaussian distribution of the input. The table of this diagram may be implemented for an exemplary embodiment of a 4-bit DAC. It assumes any ternary (or tri-state) type devices (e.g., current or voltage sources) respectively implemented for each respective bit (e.g., each respective bit corresponds to one of the (or tri-state) devices). It further assumes that each source can provide either a positive or negative signal (e.g., either a positive or negative current, or either a positive or negative voltage). A value of "0" indicates the current source is off. A value of "1" means the source provides positive current. A value of "−1" means the source provides negative current. The left column is the corresponding decimal value. The other columns are from MSB at left to LSB at right.

The positive (upper) half of the table is normal binary coding. The negative (bottom) half of the table is the mirror image of the positive half, with each "1" changed to a "−1". The most-negative number (−16), which would occur if we were using normal twos complement coding, is excluded.

It may be noticed that in this DAC coding method, the MSB column does not toggle in the center of the table; it is solidly "0". This is desirable, since it means that the MSB will stay relatively inactive when the input is a zero-mean Gaussian distribution (or approximate thereof), where most of the values occur around the center, and larger numbers occur less frequently. By contrast, in a normal twos-complement binary coding table, the MSB would toggle at the zero point, so it would be quite active.

It may also be noticed that since the MSB spends most of its time at value "0" when the input is a zero-mean Gaussian distribution (or approximate thereof), the MSB has very low power consumption. This may be very important in certain power-sensitive implementations. The MSB only consumes power on the rare occasions (e.g., 1% of the time) when it is actively producing a peak.

Such DAC encoding of such a 4-bit DAC may be broken up or partitioned into two sub-DACs. The 3 LSBs become DAC1, and the MSB becomes DAC2. DAC2 is 0 most of the time given a Gaussian input signal (or approximate thereof), and occasionally is 1 for a brief peak. DAC1 is allowed to roll over naturally, so when a large peak occurs, say the input value is 13, DAC1 rolls over per the table and puts out the value binary "1, 0, 1"=decimal 5, and DAC2 puts out the value 1=decimal 8; the sum is 8+5=13, which is correct. Similarly, say the input value is −13; DAC1 puts out the binary value "−1, 0, −1"=decimal −5, and DAC2 puts out the value −1=decimal −8; the sum is −8+−5=−13, which is also correct.

This DAC coding operates in accordance with exploiting the distribution (e.g., Gaussian or approximate thereof) of the signal. An auxiliary DAC2 can be implemented with less precision than main DAC1, since such DAC2 is used infrequently. DAC2 can be thought of as an auxiliary range-extension current or voltage source, which gives a 6 dB range extension. Such an implementation provided for extension of the range of a DAC by 6 dB with respect to its clipping point.

As may be seen with respect to the DAC encoding of this diagram, an appropriately designed table may be implemented such that one or more individual ternary (or tri-state) devices is implemented within one or more DAC's may operate based upon a codeword provided thereto, and more specifically, based upon the individual bits of a given codeword. Of course, it is noted that with respect to such ternary (or tri-state) operation, the respective 'bit' values may be implemented as 'symbols' in certain embodiments. For example, to represent three respective distinct values, two bits may be used (e.g., to represent 3 values such as 00, 01, 10). Of course, it is noted that alternative embodiments may be employed such that a ternary (or tri-state) signal may be provided respectively to the one or more individual ternary (or tri-state) devices is implemented within one or more DAC's without departing from the scope and spirit of the invention.

Figure 27:
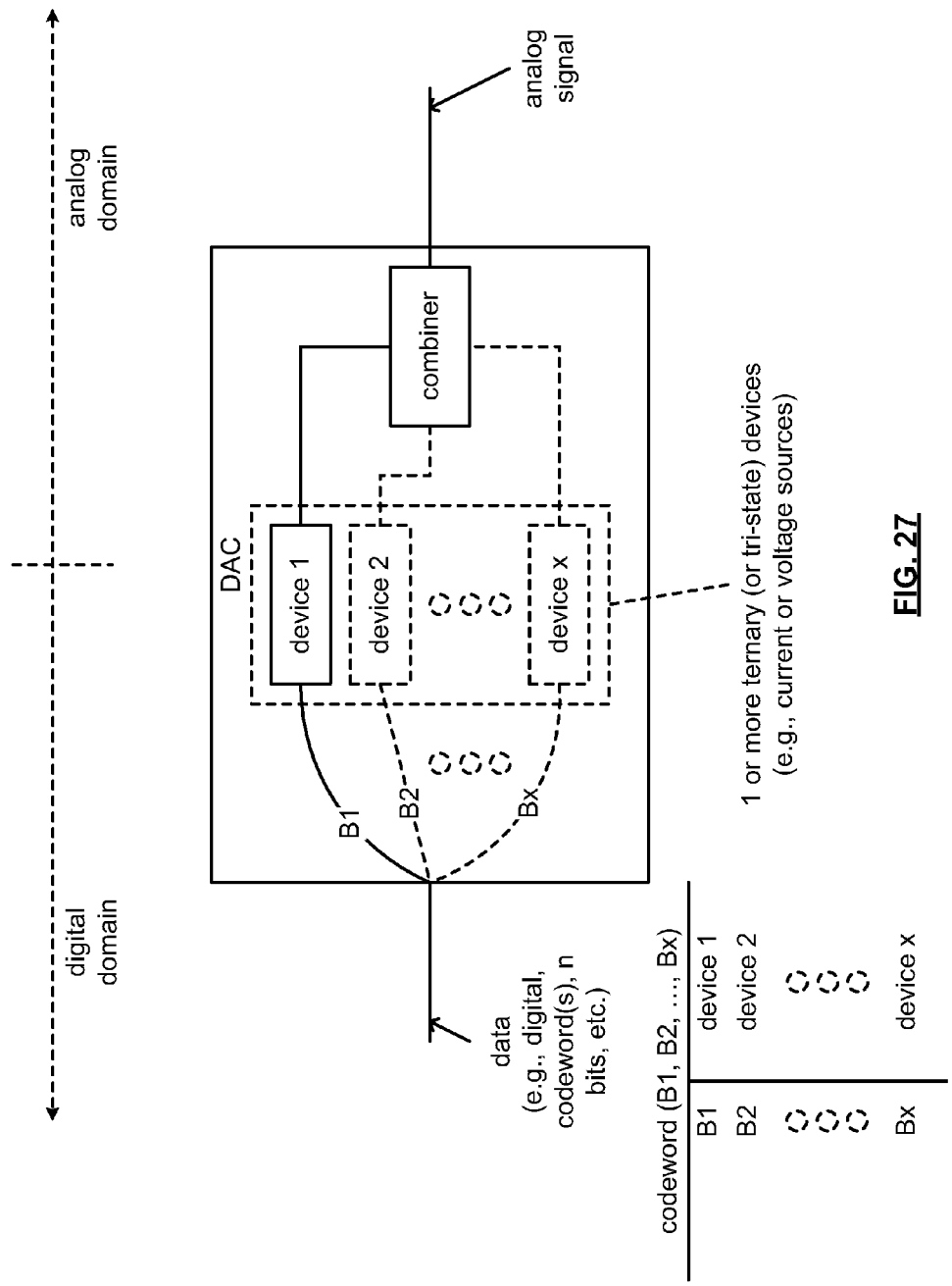
FIG. 27 illustrates an embodiment of an architecture operative for performing of DAC encoding in accordance with one or more ternary (or tri-state) devices.

FIG. 27 illustrates an embodiment 2700 of an architecture operative for performing of DAC encoding in accordance with one or more ternary (or tri-state) devices. As may be seen with respect to this diagram, a number of different respective devices, that operate in accordance with ternary (or tri-state) operation, are respectively provided the individual bit values of a codeword provided to a DAC. Each of the respective ternary (or tri-state) may be implemented in any of a number of desired ways. For example, each of them may be implemented as a respective current source, a respective voltage source, a combination thereof, etc. A combiner is implemented to process each of the respective signals provided from the respective ternary (or tri-state) devices in accordance with generating an analog signal, which may be viewed as an output signal from the DAC.

As described with respect other embodiments and/or diagrams herein, it is noted that the respective signals the one or more of the respective analog signals generated by the respective ternary (or tri-state) devices may be negative in value such that, upon combination with other respective analog signal, one or more of the other analog signals is reduced in value generally speaking, the combination of different respective analog signals may be viewed as a combination of respective analog signals that may be positive valued, negative valued, or zero valued.

Figure 28:
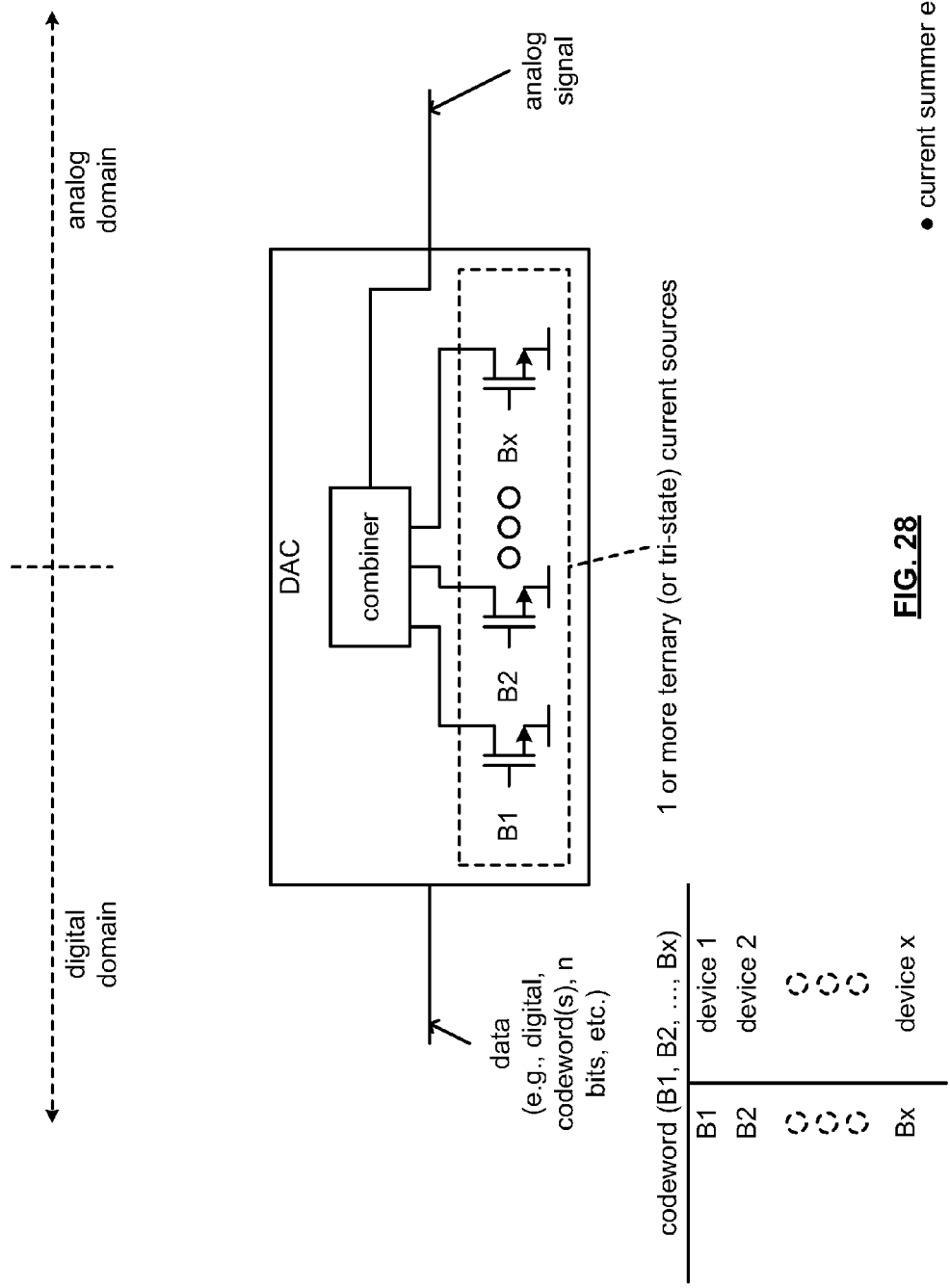
FIG. 28 illustrates an embodiment of an architecture operative for performing of DAC encoding in accordance with one or more ternary (or tri-state) current sources.

FIG. 28 illustrates an embodiment 2800 of an architecture operative for performing of DAC encoding in accordance with one or more ternary (or tri-state) current sources. This diagram shows an implementation of a number of ternary (or tri-state) current sources are respectively provided the individual bit values of a codeword provided to a DAC. As may be understood, the different respective current sources may provide either a positively valued current (e.g., deliver current), a negatively valued current (e.g., draw current), or may provide no current (e.g., neither delivered nor draw current). The combiner operates by receiving all of the respective signals provided from the respective current sources, whether they be positively valued, negatively valued, or zero valued, and generates an analog signal there from, which may be viewed as an output signal from the DAC.

Figure 29:
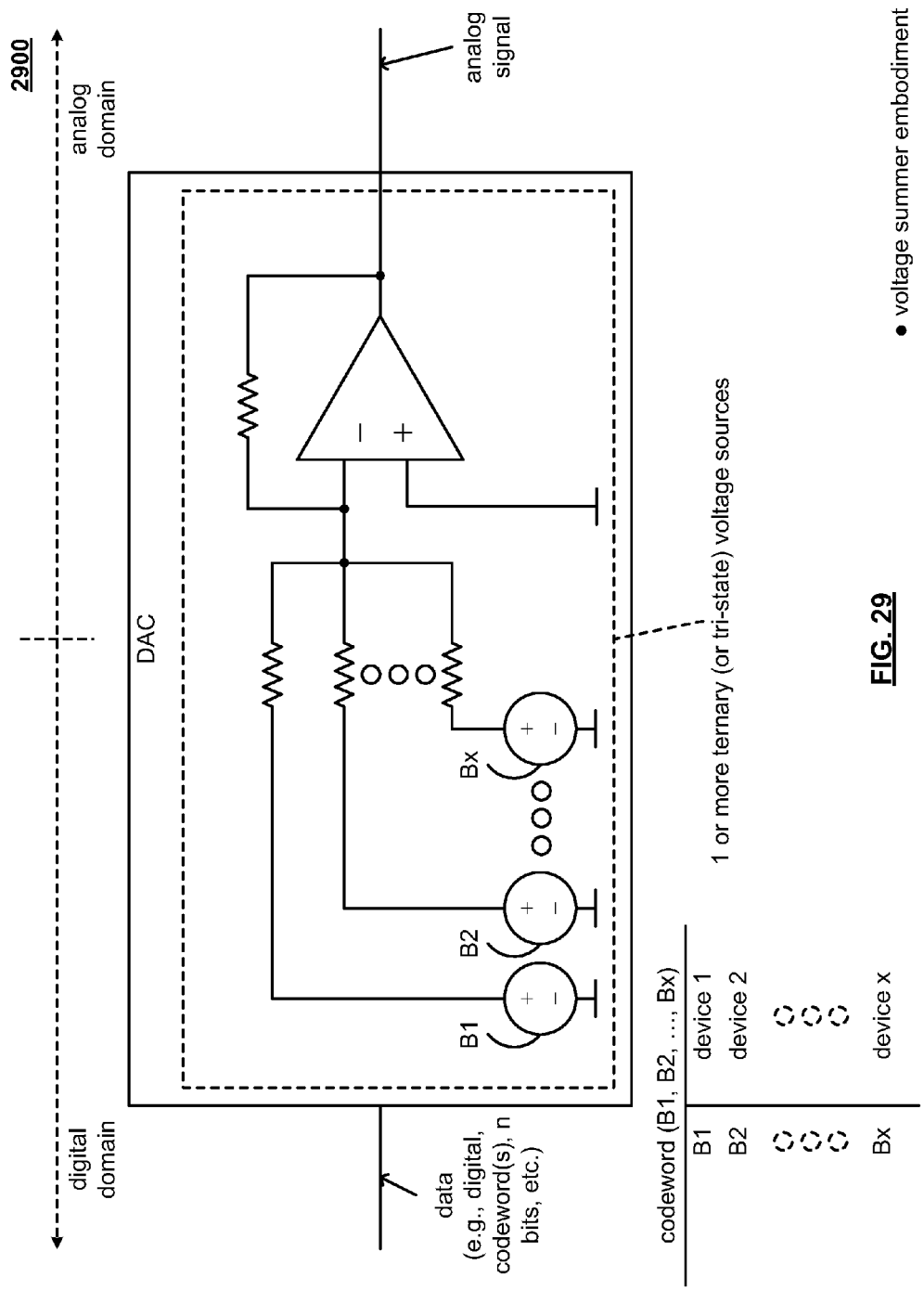
FIG. 29 illustrates an embodiment of an architecture operative for performing of DAC encoding in accordance with one or more ternary (or tri-state) voltage sources.

FIG. 29 illustrates an embodiment 2900 of an architecture operative for performing of DAC encoding in accordance with one or more ternary (or tri-state) voltage sources. This diagram shows an implementation of a number of ternary (or tri-state) voltage sources are respectively provided the individual bit values of a codeword provided to a DAC. As may be understood, the different respective voltage sources may provide either a positively valued voltage (e.g., increase or add to other voltages), a negatively valued voltage (e.g., decrease or reduce other voltages), or may provide no voltage (e.g., neither increase nor decrease the other voltages). The combiner operates by receiving all of the respective signals provided from the respective voltage sources, whether they be positively valued, negatively valued, or zero valued, and generates an analog signal there from, which may be viewed as an output signal from the DAC.

Figure 30:
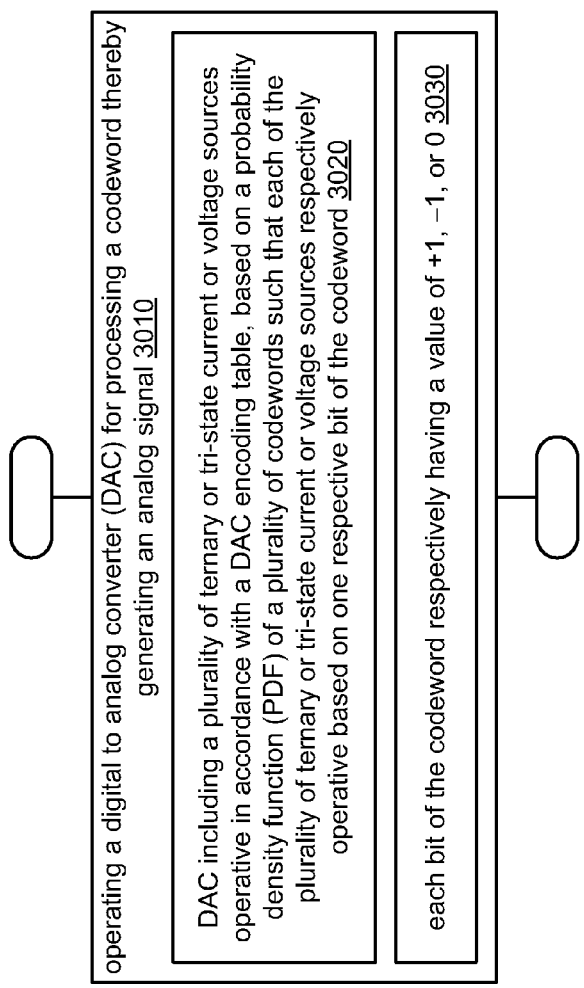
FIG. 30 and FIG. 31 illustrate various alternative embodiments of methods for operating one or more communication devices or devices including one or more DACs.
Figure 31:
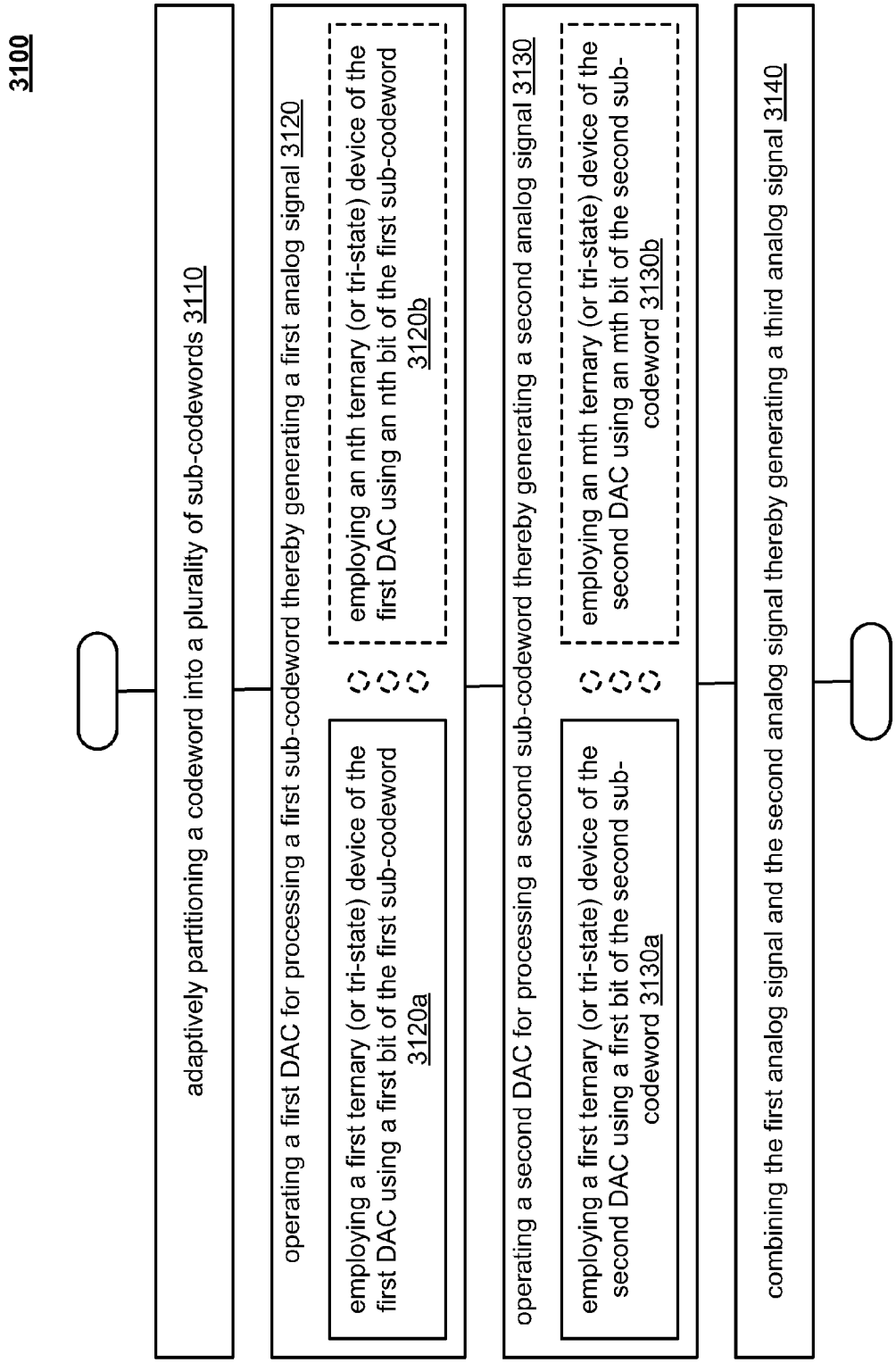

FIG. 30 and FIG. 31 illustrate various alternative embodiments of methods for operating one or more communication devices or devices including one or more DACs. Generally speaking, the embodiments of the methods of these two diagrams may generally be viewed as relating to, though not limited to, operating one or more DACs including one or more ternary or tri-state devices.

Referring to method 3000 of FIG. 30, the method 3000 begins by operating a digital to analog converter (DAC) for processing a codeword thereby generating an analog signal, as shown in a block 3010.

In certain embodiments, with respect to the method 3000, the DAC is implemented as including a plurality of ternary or tri-state current or voltage sources operative in accordance with a DAC encoding table based on a probability density function (PDF) of a plurality of codewords such that each of the plurality of ternary or tri-state current or voltage sources respectively operative based on one respective bit of the codeword, as shown in a block 3020. Also, in some embodiments, with respect to the method 3000, each bit of the codeword respectively having a value of +1, −1, or 0, as shown in a block 3030.

Referring to method 3100 of FIG. 31, the method 3100 begins by adaptively partitioning a codeword into a plurality of sub-codewords, as shown in a block 3110.

The method 3100 continues by operating a first DAC for processing a first sub-codeword thereby generating the first analog signal, as shown in a block 3120.

As may be understood with respect to some embodiments, the operations of the block 3120 may be implemented by employing a first ternary (or tri-state) device of the first DAC using a first bit of the first sub-codeword, as shown in a block 3120a. In an instance in which the first DAC includes a number of respective ternary (or tri-state) devices, each respective bit of the first sub-codeword is provided to a respective one of the respective ternary (or tri-state) devices. For example, in an embodiment in which the first DAC includes n respective ternary (or tri-state) devices, then the method 3100 may operate by employing an nth ternary (or tri-state) device of the first DAC using an nth bit of the first sub-codeword, as shown in a block 3120b.

Considering an implementation in which a device includes two respective DACs, the method 3100 then operates by operating a second DAC for processing a second sub-codeword thereby generating a second analog signal, as shown in a block 3130.

As may be understood with respect to some embodiments, the operations of the block 3130 may be implemented by employing a first ternary (or tri-state) device of the second DAC using a first bit of the second sub-codeword, as shown in a block 3130a. In an instance in which the second DAC includes a number of respective ternary (or tri-state) devices, each respective bit of the second sub-codeword is provided to a respective one of the respective ternary (or tri-state) devices. For example, in an embodiment in which the second DAC includes n respective ternary (or tri-state) devices, then the method 3100 may operate by employing an nth ternary (or tri-state) device of the second DAC using an nth bit of the second sub-codeword, as shown in a block 3130b.

The method 3100 then continues by combining the first analog signal and the second analog signal thereby generating a third analog signal, as shown in a block 3140, which may be viewed as being an output signal from a DAC that includes respectively therein a first DAC and a second DAC (e.g., such as in accordance with an embodiment of a DAC that includes more than one respective sub DAC's).

Figure 32:
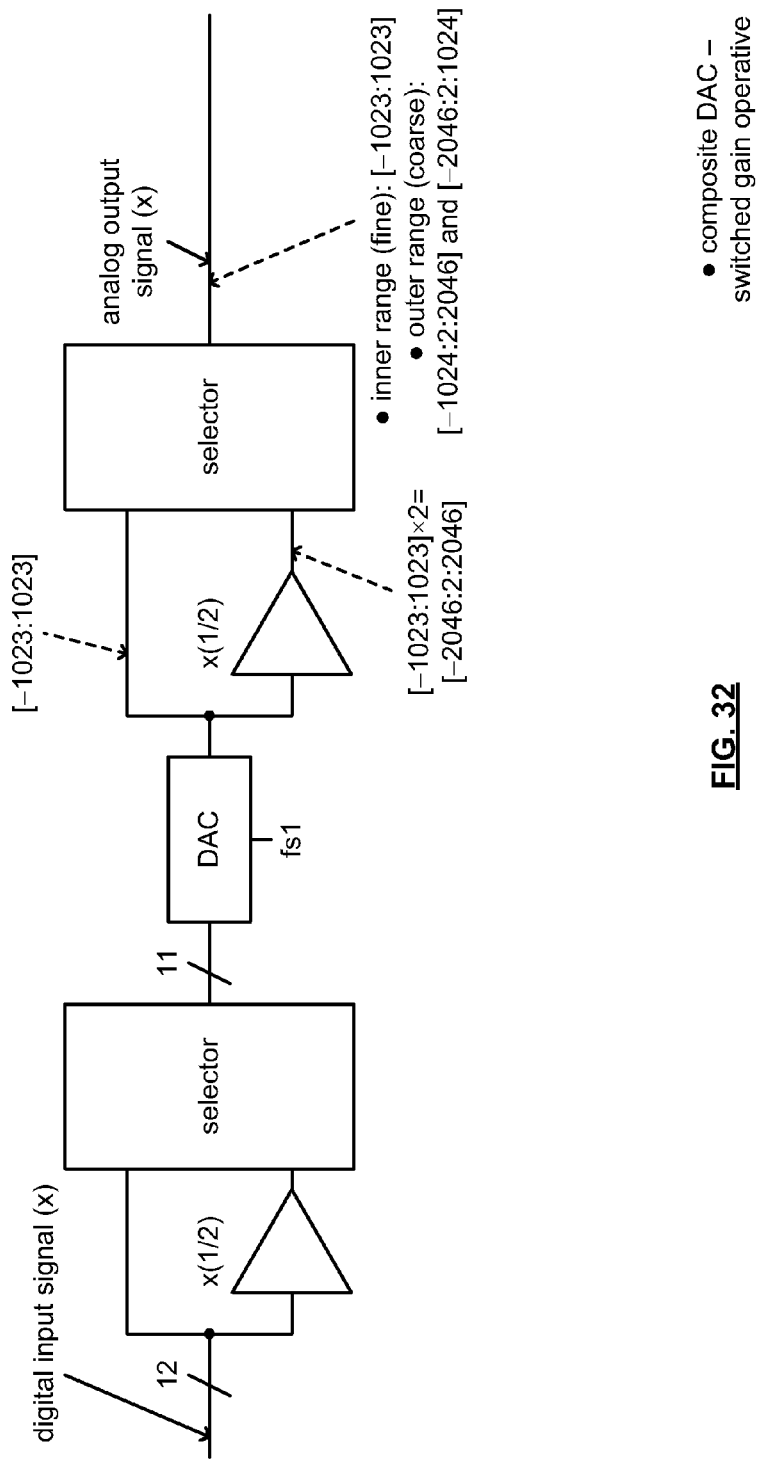
FIG. 32 illustrates an embodiment of a composite DAC that is switched gain operative.

FIG. 32 illustrates an embodiment 3200 of a composite DAC that is switched gain operative. As may be seen with respect to this diagram, a number of respective stages may be implemented such that either a digital input signal and/or the respective analog signal output from a DAC may undergo splitting into two respective paths such that one of them is scaled (e.g., gain adjusted either up or down). Selection, such as implemented by one of the respective selectors within the architecture, may be used to select one of the respective output paths. For example, considering the splitting of the digital input signal into two respective paths such that one of them undergoes scaling, the selector located on the left-hand side of the diagram may select either the non-scaled version of the digital input signal or the scaled version of the digital input signal.

Analogously, considering the splitting of the analog signal output from the DAC into two respective paths such that one of them undergoes scaling, the selector located on the right-hand side of the diagram may select either the non-scaled version of the analog signal or the scaled version of the analog signal.

Figure 33:
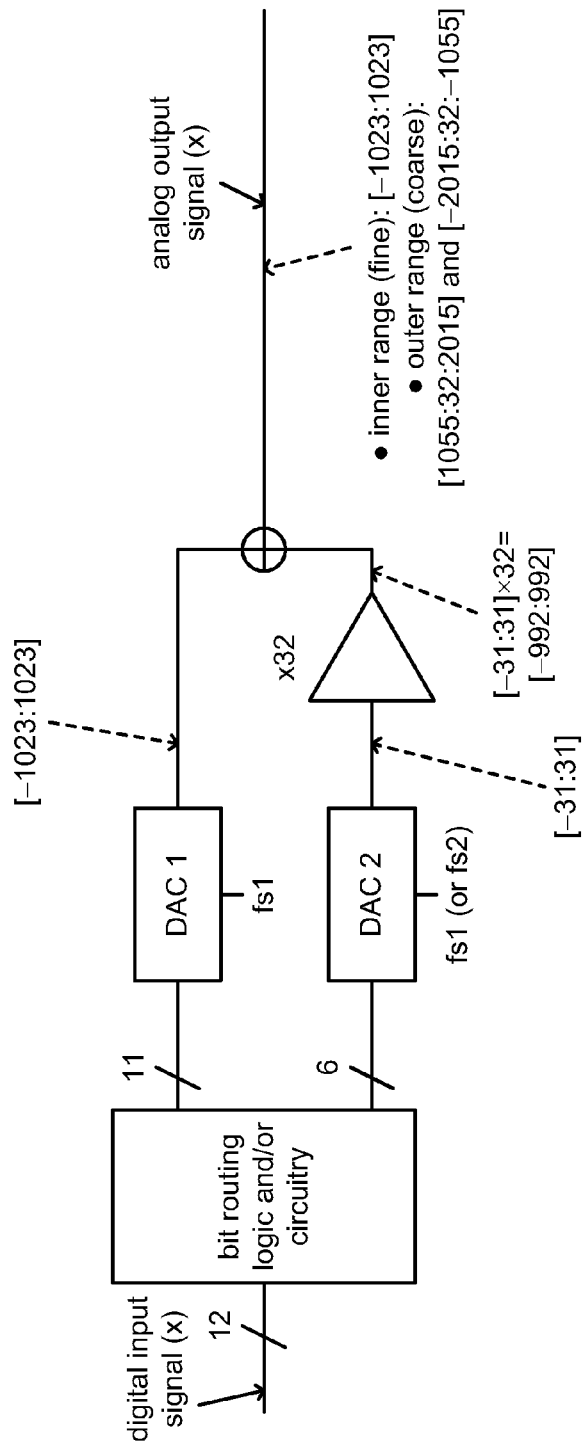
FIG. 33 illustrates an embodiment of a composite DAC operative that is summing operative with two sub-DACs.

FIG. 33 illustrates an embodiment 3300 of a composite DAC operative that is summing operative with two sub-DACs. As may be seen with respect to this diagram, the respective outputs of two different DAC's are combined, such that the output of at least one of the DAC's undergoes scaling. As may be understood, appropriate scaling of an analog signal output from at least one of the DAC's provides for independent and individual adjustment in each of a number of different respective ranges of an analog output signal. For example, an analog signal output from a first of the DAC's may generally be viewed as being tailored towards an inner or fine range, and an analog signal output from the second of the DAC's may generally be viewed as being tailored towards an outer or coarse range.

Figure 34:
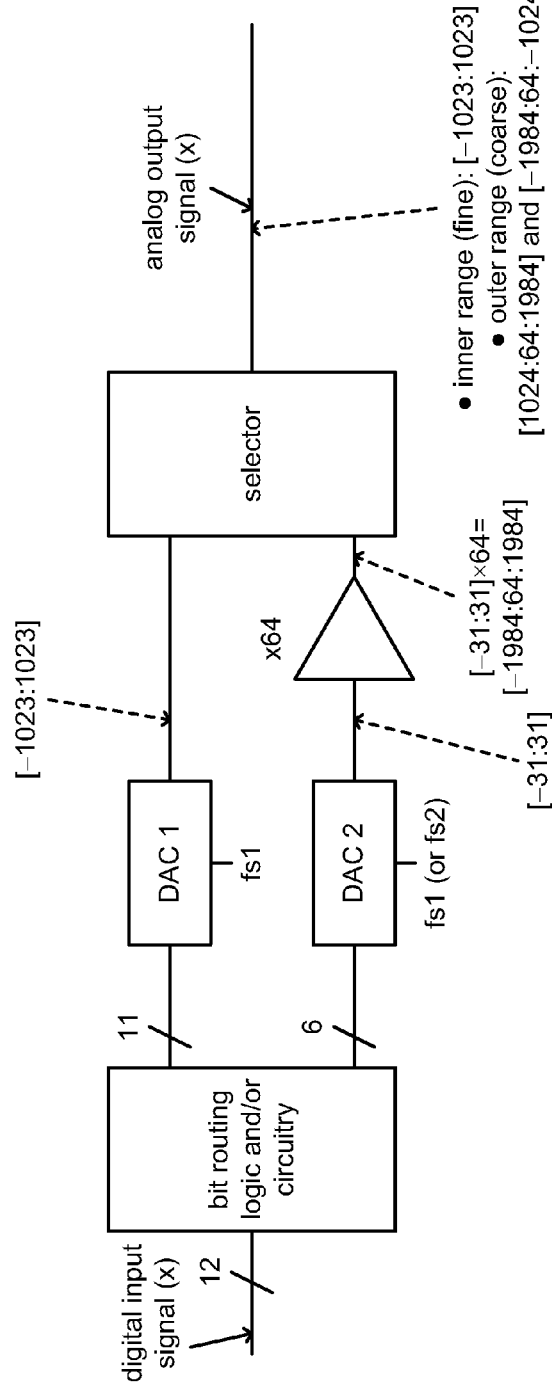
FIG. 34 illustrates an embodiment of a composite DAC operative that is switching operative with two sub-DACs.

FIG. 34 illustrates an embodiment 3400 of a composite DAC operative that is switching operative with two sub-DACs. As may be seen with respect to this diagram, a select door is implemented on the right-hand side of the diagram for selecting either the output from the first DAC or a scaled version of the output from the second DAC. In accordance with such an implementation, as with respect to other embodiments described herein, appropriate selection of one analog signal from a number of analog signals output from different respective DAC's will allow for appropriate selection of an analog output signal being within a desired range.

Herein, various aspects, and their equivalents, of the various means, functionalities, architectures, etc. are presented that may be adapted for increasing the dynamic range of a DAC, reducing the effects of clipping, and increasing power efficiency. These various aspects, and their equivalents, of the various means, functionalities, architectures, etc. may be implemented to utilize an auxiliary DAC in various ways to handle clipped samples, soften, reduce, cancel, and/or eliminate the clipping effect. In one possible embodiment, one or more auxiliary DACs may have significantly lower complexity than the main DAC.

In some embodiments, such a processing module can perform such processing to generate signals for transmission using at least one of any number of transmitters and/or radios and at least one of any number of communication interfaces, ports, and/or antennae to another communication device (e.g., which also may include at least one of any number of transmitters and/or radios and at least one of any number of communication interfaces, ports, and/or antennae) in accordance with various aspects of the invention, and/or any other operations and functions as described herein, etc. or their respective equivalents. In some embodiments, such processing is performed cooperatively by a first processing module in a first device, and a second processing module within a second device. In other embodiments, such processing is performed wholly by a processing module implemented within one given device.

As may be used herein, the terms "substantially" and "approximately" (or equivalents, variants, etc. thereof) provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" (e.g., including various modules and/or circuitries such as may be operative, implemented, and/or for encoding, for decoding, for baseband processing, etc.) may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory (ROM), random access memory (RAM), volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous-time or discrete-time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. An apparatus comprising:
a codeword parser configured to partition adaptively a codeword into a first plurality of sub-codewords and a second codeword into a second plurality of sub-codewords based on at least one of at least one local operating characteristic, or change thereof, of the apparatus and at least one remote operating characteristic, or change thereof, of at least one additional apparatus in communication with the apparatus via at least one communication network;
a first digital to analog converter (DAC) configured to process a first of the first plurality of sub-codewords to generate a first analog signal;
a second DAC configured to process a second of the first plurality of sub-codewords to generate a second analog signal; and
a combiner configured to combine the first analog signal and the second analog signal to generate a first output analog signal; and
wherein the first DAC is further configured to process a first of the second plurality of sub-codewords to generate a third analog signal;
the second DAC is further configured to process a second of the second plurality of sub-codewords to generate a fourth analog signal;
the combiner is further configured to combine the third analog signal and the fourth analog signal to generate a second output analog signal; and
the codeword parser is further configured to partition adaptively the codeword into the first plurality of sub-codewords to ensure that the first of the first plurality of sub-codewords having a magnitude less than a maximum input magnitude of the first DAC by a first amount and the second of the first plurality of sub-codewords having a magnitude less than a maximum input magnitude of the second DAC by a second amount.

2. The apparatus of claim 1, wherein the first of the first plurality of sub-codewords including a first number of bits; and
the second of the first plurality of sub-codewords including a second number of bits that is different than the first number of bits;
the first of the second plurality of sub-codewords including a third number of bits; and
the second of the second plurality of sub-codewords including a fourth number of bits.

3. The apparatus of claim 1, wherein at least one of the first plurality of sub-codewords generated being based on a first quantization step; and
at least one of the second plurality of sub-codewords being generated based on a second quantization step.

4. The apparatus of claim 1, wherein the codeword parser is further configured to partition adaptively the codeword into the first plurality of sub-codewords to ensure that the first of the plurality of sub-codewords having a magnitude less than a maximum input magnitude of the first DAC by a first amount and the second of the plurality of sub-codewords having a magnitude less than a maximum input magnitude of the second DAC by a second amount.

5. The apparatus of claim 1, wherein the apparatus being a communication device that is operative within at least one of a satellite communication system, a wireless communication system, a wired communication system, a fiber-optic communication system, and a mobile communication system.

6. A communication device comprising:
a codeword parser configured to partition adaptively a codeword into a plurality of sub-codewords based on at least one of at least one local operating characteristic based on provisioned or currently available processing resources or memory within the communication device, or change thereof, of the communication device and at least one remote operating characteristic, or change thereof, of at least one additional communication device in communication with the communication device via at least one communication network;
a first digital to analog converter (DAC) configured to process a first of the plurality of sub-codewords to generate a first analog signal;
a second DAC configured to process a second of the plurality of sub-codewords to generate a second analog signal; and
a combiner configured to combine the first analog signal and the second analog signal to generate a third analog signal.

7. The communication device of claim 6, wherein the first of the plurality of sub-codewords including a first number of bits; and
the second of the plurality of sub-codewords including a second number of bits that is different than the first number of bits.

8. The communication device of claim 6, wherein the codeword parser is further configured to partition adaptively at least one additional codeword into at least one additional plurality of sub-codewords based on the at least one of at least one local operating characteristic, or change thereof, of the communication device and the at least one remote operating characteristic, or change thereof, of the at least one additional communication device in communication with the communication device via the at least one communication network;
the first DAC is further configured to process a first of the at least one additional plurality of sub-codewords to generate the third analog signal;
the second DAC is further configured to process a second of the at least one additional plurality of sub-codewords to generate a fourth analog signal; and
the combiner is further configured to combine the third analog signal and the fourth analog signal to generate at least one additional analog signal.

9. The communication device of claim 8, wherein the first of the plurality of sub-codewords including a first number of bits;
the second of the plurality of sub-codewords including a second number of bits that is different than the first number of bits;
the first of the at least one additional plurality of sub-codewords including a third number of bits; and
the second of the at least one additional plurality of sub-codewords including a fourth number of bits.

10. The communication device of claim 8, wherein each of the first of the plurality of sub-codewords and the second of the at least one additional plurality of sub-codewords respectively including a first number of bits; and
each of the second of the plurality of sub-codewords and the first of the at least one additional plurality of sub-codewords respectively including a second number of bits.

11. The communication device of claim 8, wherein at least one of the plurality of sub-codewords generated based on a first quantization step; and
at least one of the at least one additional plurality of sub-codewords generated based on a second quantization step.

12. The communication device of claim 6, wherein the codeword parser is further configured to partition adaptively the codeword into the plurality of sub-codewords to ensure that the first of the plurality of sub-codewords having a magnitude less than a maximum input magnitude of the first DAC by a first amount and the second of the plurality of sub-codewords having a magnitude less than a maximum input magnitude of the second DAC by a second amount.

13. The apparatus of claim 12, wherein at least one of the first amount and the second amount adaptively based on the at least one of at least one local operating characteristic, or change thereof, of the communication device and the at least one remote operating characteristic, or change thereof, of the at least one additional communication device in communication with the communication device via the at least one communication network.

14. The apparatus of claim 6, wherein communication device is operative within at least one of a satellite communication system, a wireless communication system, a wired communication system, a fiber-optic communication system, and a mobile communication system.

15. A method for execution by a communication device that includes a plurality of digital to analog converters (DACs), the method comprising:
adaptively partitioning a codeword into a plurality of sub-codewords based on at least one of at least one local operating characteristic based on provisioned or currently available processing resources or memory within the communication device, or change thereof, of the communication device and at least one remote operating characteristic, or change thereof, of at least one additional communication device in communication with the communication device via at least one communication network;
operating a first digital to analog converter (DAC) for processing a first of the plurality of sub-codewords to generate a first analog signal;
operating a second DAC for processing a second of the plurality of sub-codewords thereby generating a second analog signal; and
combining the first analog signal and the second analog signal to generate a third analog signal.

16. The method of claim 15, wherein the first of the plurality of sub-codewords including a first number of bits; and
the second of the plurality of sub-codewords including a second number of bits that is different than the first number of bits.

17. The method of claim 15, further comprising:
adaptively partitioning at least one additional codeword into at least one additional plurality of sub-codewords based on the at least one of at least one local operating characteristic, or change thereof, of the communication device and the at least one remote operating characteristic, or change thereof, of the at least one additional communication device in communication with the communication device via the at least one communication network;
operating the first DAC for processing a first of the at least one additional plurality of sub-codewords to generate the third analog signal;
operating the second DAC for processing a second of the at least one additional plurality of sub-codewords to generate a fourth analog signal; and
combining the third analog signal and the fourth analog signal to generate at least one additional analog signal.

18. The method of claim 17, wherein the first of the plurality of sub-codewords including a first number of bits;
the second of the plurality of sub-codewords including a second number of bits,
the first of the at least one additional plurality of sub-codewords including a third number of bits; and
the second of the at least one additional plurality of sub-codewords including a fourth number of bits.

19. The method of claim 17, wherein each of the first of the plurality of sub-codewords and the second of the at least one additional plurality of sub-codewords respectively including a first number of bits; and
each of the second of the plurality of sub-codewords and the first of the at least one additional plurality of sub-codewords respectively including a second number of bits.

20. The method of claim 17, wherein at least one of the plurality of sub-codewords generated based on a first quantization step; and
at least one of the at least one additional plurality of sub-codewords generated based on a second quantization step.

21. The method of claim 15, further comprising:
adaptively partitioning the codeword into the plurality of sub-codewords to ensure that the first of the plurality of sub-codewords having a magnitude less than a maximum input magnitude of the first DAC by a first amount and the second of the plurality of sub-codewords having a magnitude less than a maximum input magnitude of the second DAC by a second amount.

22. The method of claim 21, wherein at least one of the first amount and the second amount adaptively based on the at least one of at least one local operating characteristic, or change thereof, of the communication device and the at least one remote operating characteristic, or change thereof, of the at least one additional communication device in communication with the communication device via the at least one communication network.

23. The method of claim 15, wherein the device being a communication device that is operative within at least one of a satellite communication system, a wireless communication system, a wired communication system, a fiber-optic communication system, and a mobile communication system.

* * * * *